(12) United States Patent
Tsai et al.

(10) Patent No.: US 9,293,534 B2
(45) Date of Patent: Mar. 22, 2016

(54) FORMATION OF DISLOCATIONS IN SOURCE AND DRAIN REGIONS OF FINFET DEVICES

(71) Applicant: Taiwan Semiconductor Manufacturing Company, Ltd., Hsin-Chu (TW)

(72) Inventors: Chun Hsiung Tsai, Xinpu Township (TW); Wei-Yuan Lu, Taipei (TW); Chien-Tai Chan, Hsin-Chu (TW); Wei-Yang Lee, Taipei (TW); Da-Wen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/222,401

(22) Filed: Mar. 21, 2014

(65) Prior Publication Data

US 2015/0270342 A1 Sep. 24, 2015

(51) Int. Cl.
*H01L 29/08* (2006.01)
*H01L 29/78* (2006.01)
*H01L 29/66* (2006.01)
(Continued)

(52) U.S. Cl.
CPC ...... *H01L 29/0847* (2013.01); *H01L 29/41766* (2013.01); *H01L 29/66795* (2013.01); *H01L 29/7847* (2013.01); *H01L 29/7848* (2013.01); *H01L 29/7855* (2013.01); *H01L 29/7856* (2013.01); *H01L 21/0262* (2013.01); *H01L 21/02521* (2013.01); *H01L 21/02532* (2013.01)

(58) Field of Classification Search
CPC ............ H01L 29/0847; H01L 29/7855; H01L 29/7856; H01L 29/66795; H01L 29/7847; H01L 29/41766
See application file for complete search history.

(56) References Cited

U.S. PATENT DOCUMENTS 6,137,149 A 10/2000 Kodama
6,238,989 B1 5/2001 Huang et al.
(Continued)

FOREIGN PATENT DOCUMENTS

WO 2009039220 3/2009

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.
(Continued)

*Primary Examiner* — Selim Ahmed
*Assistant Examiner* — Wasiul Haider
(74) *Attorney, Agent, or Firm* — Slater & Matsil, L.L.P.

(57) ABSTRACT

Embodiments of mechanisms for forming dislocations in source and drain regions of finFET devices are provided. The mechanisms involve recessing fins and removing the dielectric material in the isolation structures neighboring fins to increase epitaxial regions for dislocation formation. The mechanisms also involve performing a pre-amorphous implantation (PAI) process either before or after the epitaxial growth in the recessed source and drain regions. An anneal process after the PAI process enables consistent growth of the dislocations in the source and drain regions. The dislocations in the source and drain regions (or stressor regions) can form consistently to produce targeted strain in the source and drain regions to improve carrier mobility and device performance for NMOS devices.

18 Claims, 15 Drawing Sheets

(51) Int. Cl.
*H01L 29/417* (2006.01)
*H01L 21/02* (2006.01)

(56) References Cited

U.S. PATENT DOCUMENTS

| | | | |
|---|---|---|---|
| 7,030,012 | B2 | 4/2006 | Divakaruni et al. |
| 8,053,273 | B2 | 11/2011 | Kammler et al. |
| 2001/0023108 | A1 | 9/2001 | Miyano et al. |
| 2005/0077570 | A1 | 4/2005 | Nishinohara |
| 2006/0084235 | A1 | 4/2006 | Barr et al. |
| 2006/0088968 | A1 | 4/2006 | Shin et al. |
| 2006/0115933 | A1 | 6/2006 | Ye et al. |
| 2006/0234504 | A1 | 10/2006 | Bauer et al. |
| 2006/0289902 | A1 | 12/2006 | Ping et al. |
| 2007/0259501 | A1 | 11/2007 | Xiong et al. |
| 2007/0287272 | A1 | 12/2007 | Bauer et al. |
| 2008/0073667 | A1* | 3/2008 | Lochtefeld .................... 257/190 |
| 2009/0075029 | A1 | 3/2009 | Thomas et al. |
| 2009/0267118 | A1 | 10/2009 | Chakravarti et al. |
| 2010/0025779 | A1 | 2/2010 | Kammler et al. |
| 2011/0117732 | A1 | 5/2011 | Bauer et al. |
| 2011/0124169 | A1 | 5/2011 | Ye et al. |
| 2011/0212584 | A9 | 9/2011 | Chakravarthi et al. |
| 2011/0266617 | A1 | 11/2011 | Nakazawa et al. |
| 2011/0269287 | A1 | 11/2011 | Tsai et al. |
| 2012/0056245 | A1 | 3/2012 | Kang et al. |
| 2012/0282718 | A1* | 11/2012 | Lochtefeld .................... 438/47 |
| 2012/0295421 | A1 | 11/2012 | Brabant et al. |
| 2013/0009216 | A1 | 1/2013 | Tsai et al. |
| 2013/0056795 | A1 | 3/2013 | Wu et al. |
| 2013/0157431 | A1 | 6/2013 | Tsai et al. |
| 2013/0200455 | A1* | 8/2013 | Lo et al. .................... 257/347 |
| 2013/0307076 | A1 | 11/2013 | Cheng et al. |
| 2013/0328126 | A1 | 12/2013 | Tsai et al. |
| 2014/0094023 | A1 | 4/2014 | Lee et al. |
| 2014/0131812 | A1* | 5/2014 | Wu et al. .................... 257/401 |
| 2014/0170840 | A1 | 6/2014 | Tsai et al. |
| 2015/0001588 | A1* | 1/2015 | Gunji et al. .................... 257/200 |

OTHER PUBLICATIONS

Fischer, P. R. et al., "Low Temperature Silcore Deposition of Undoped and Doped Silicon Films," 2006, pp. 203-215, vol. 3, Issue 2, ECS Transactions.

Hirai et al., "Independent control of microwave power and substrate temperature in chemical vaport deposition diamond sythesis,", J. of Materials Science Letters, 10, pp. 330-332, 1991.

* cited by examiner

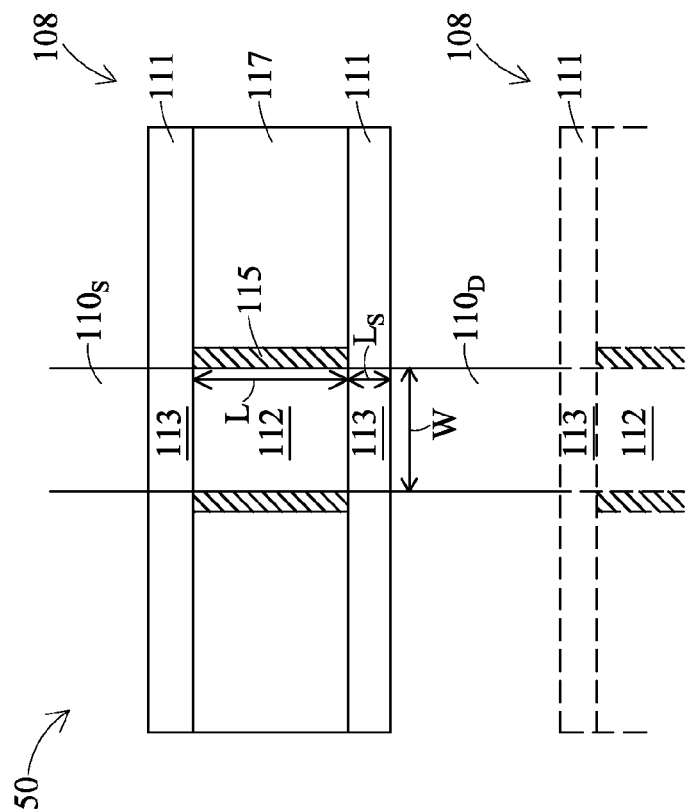
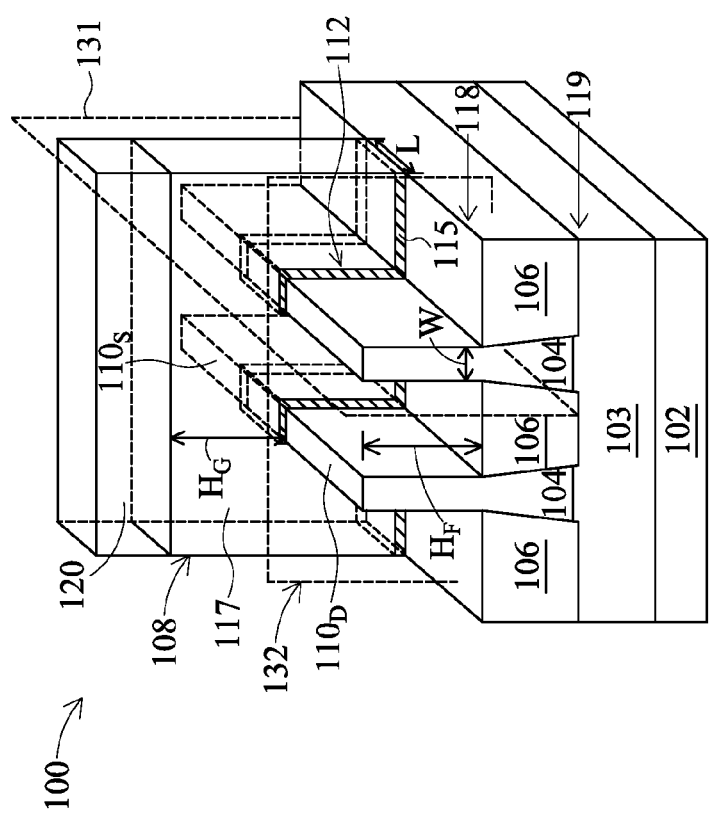
Fig. 1A
Fig. 1B

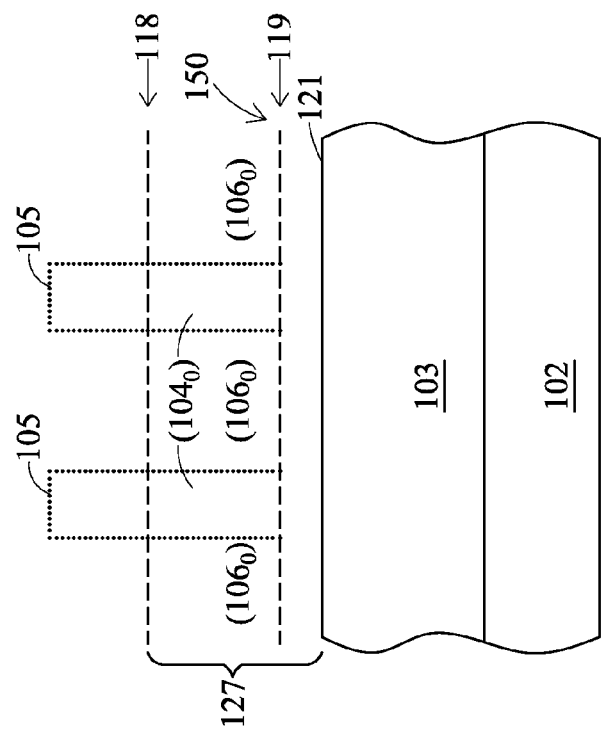
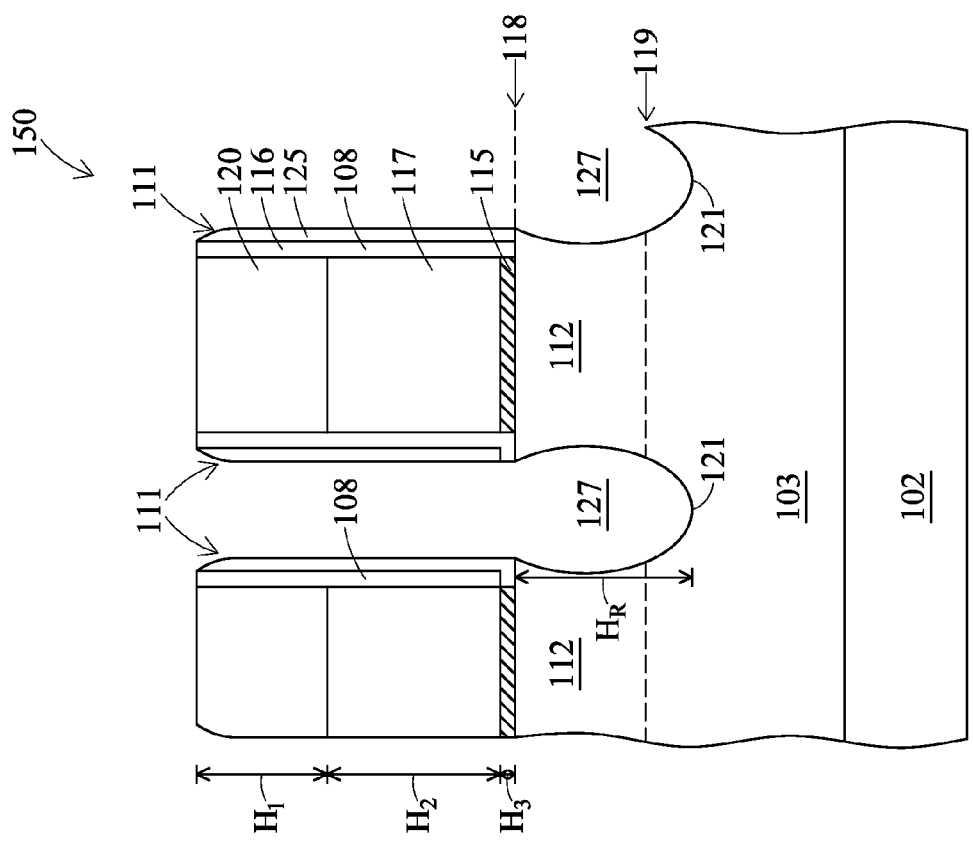
Fig. 3A
Fig. 3B

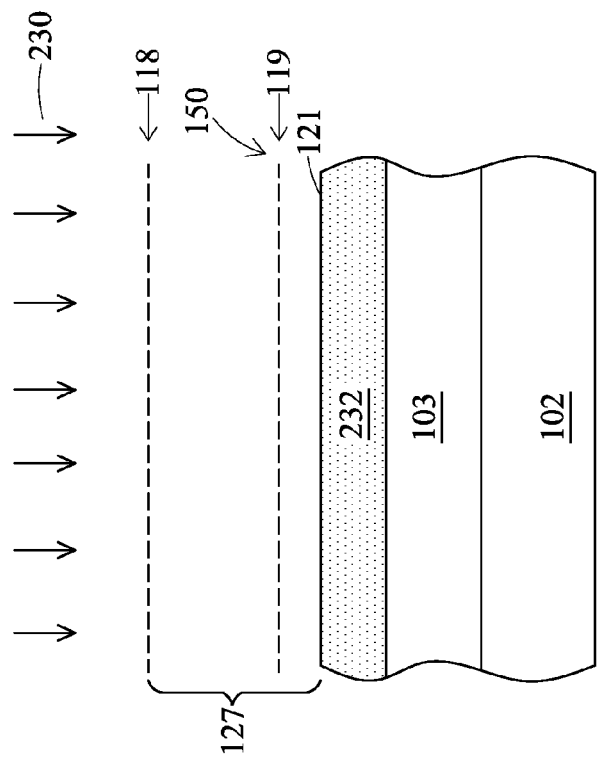
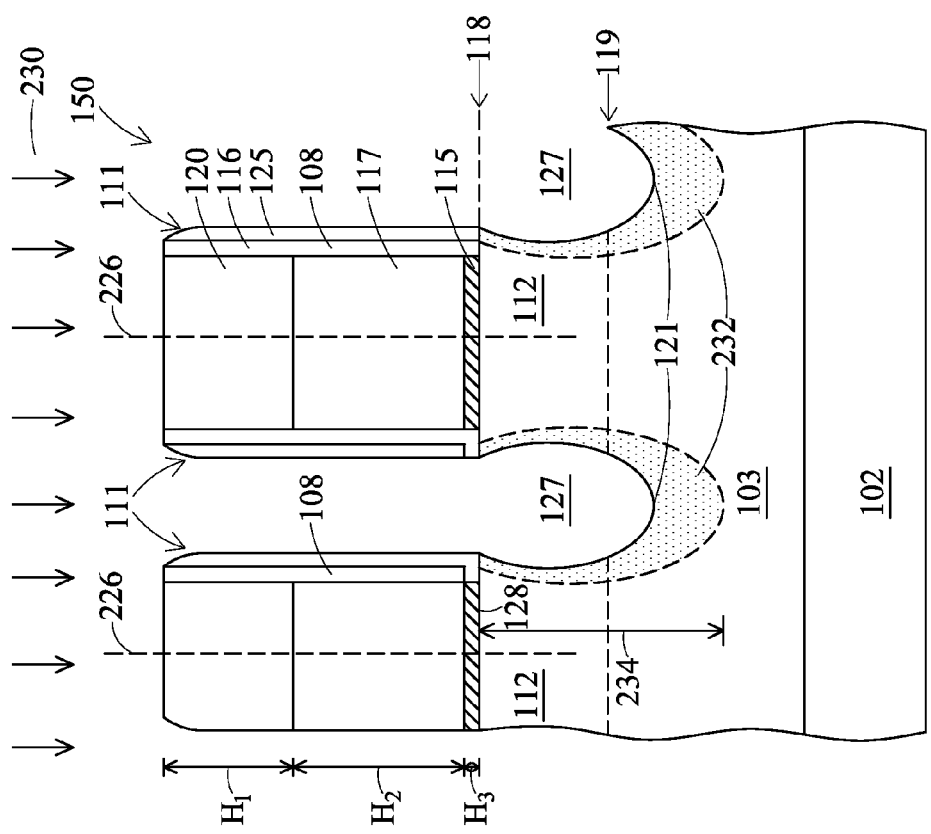
Fig. 3C
Fig. 3D

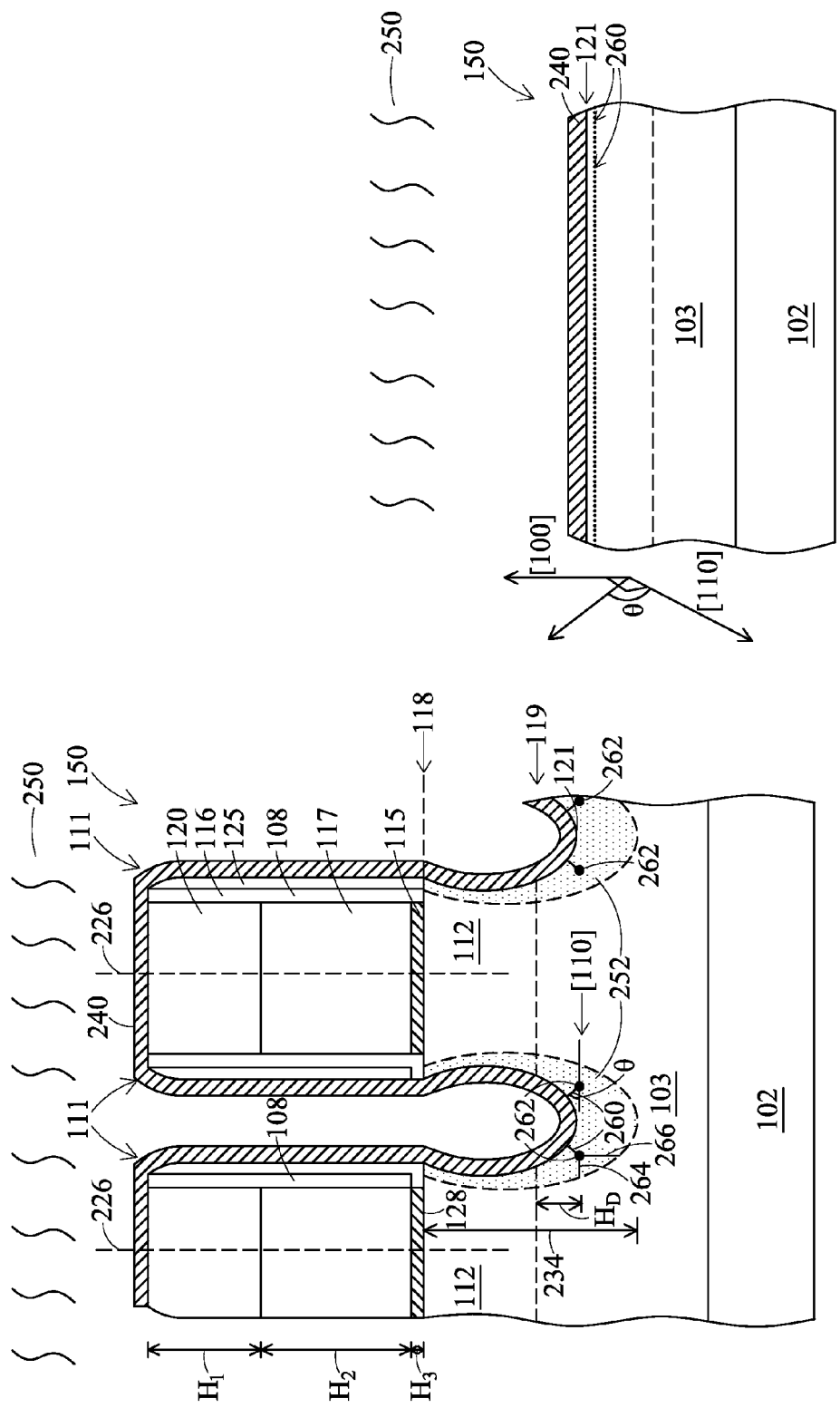

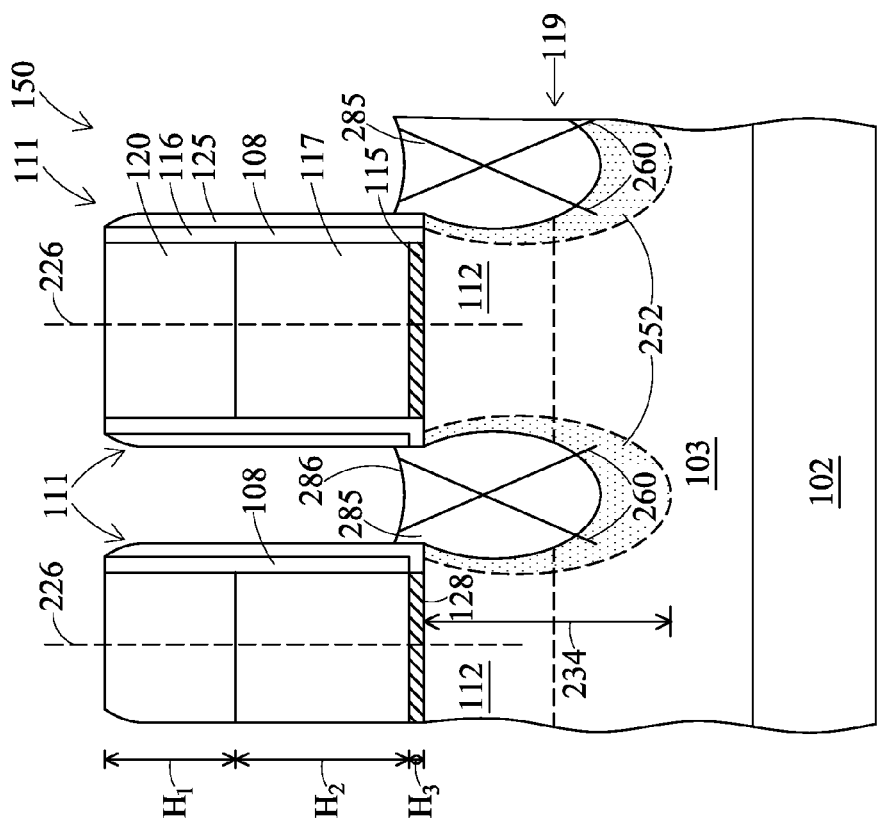
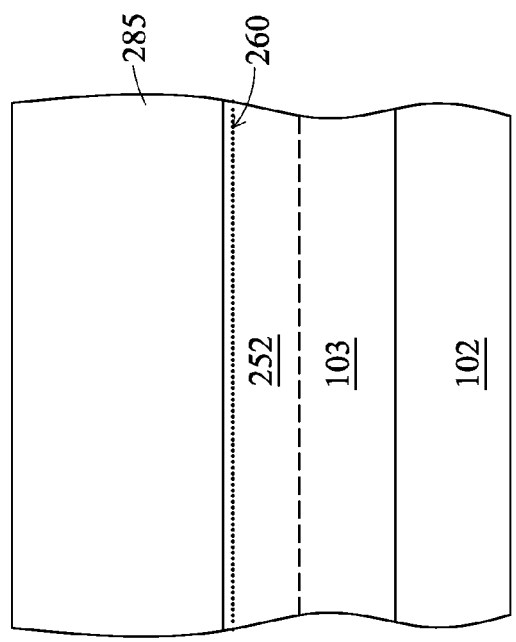
Fig. 3G
Fig. 3H

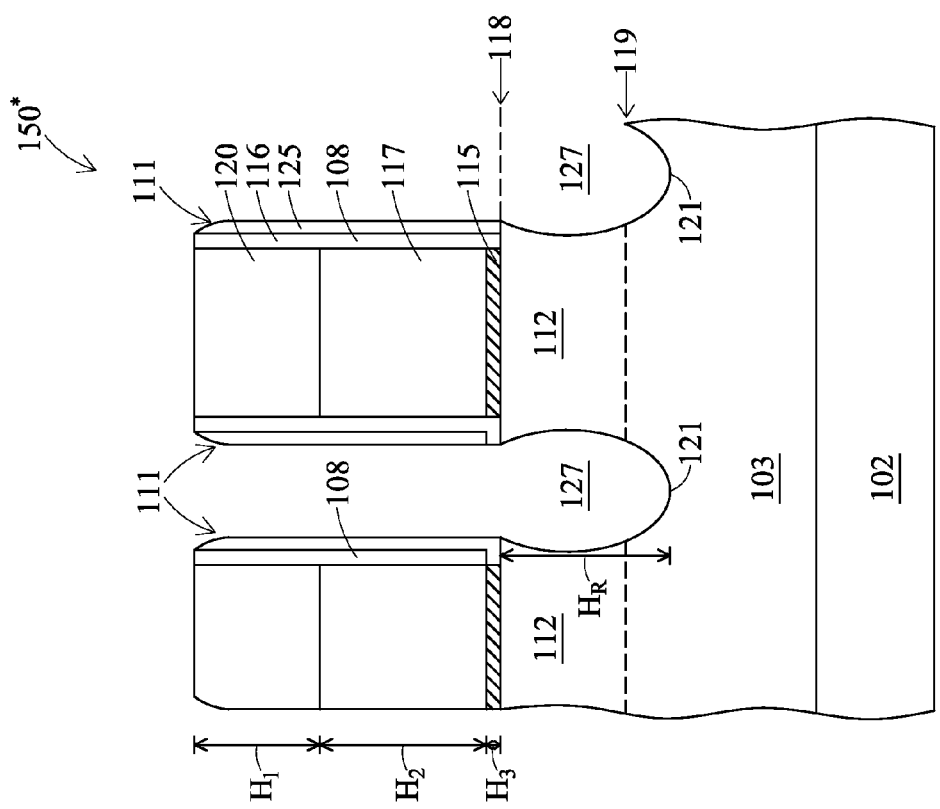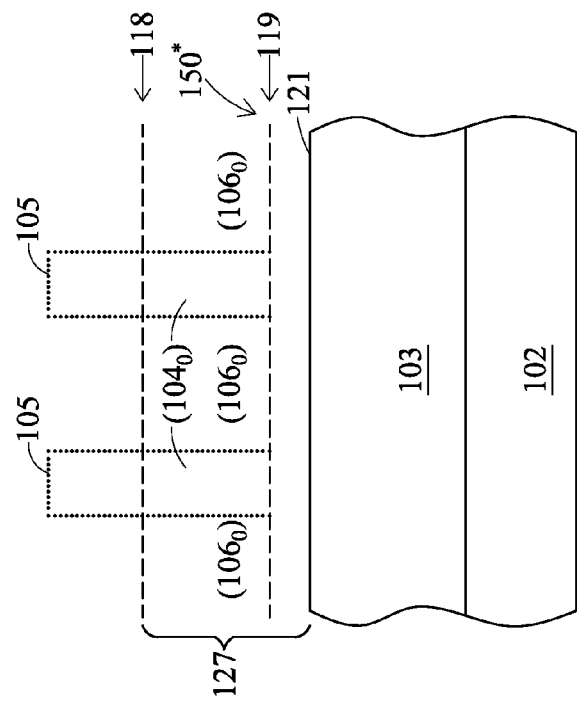
Fig. 5A
Fig. 5B

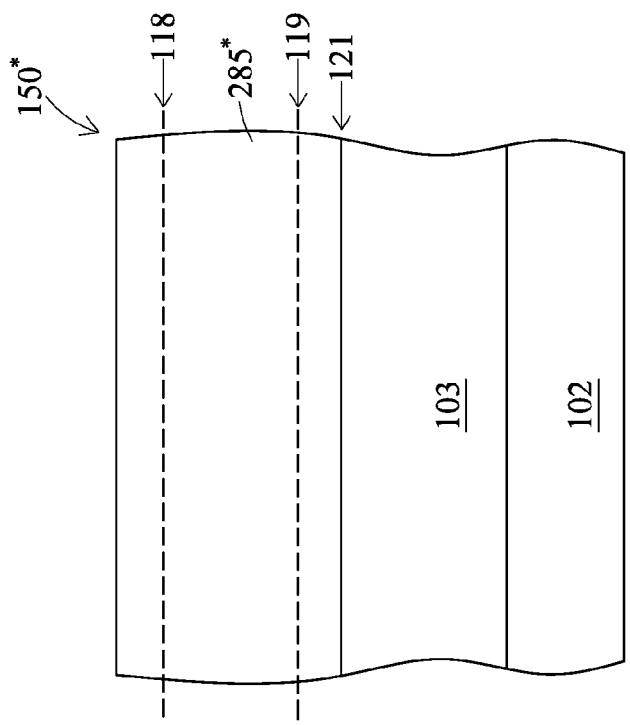
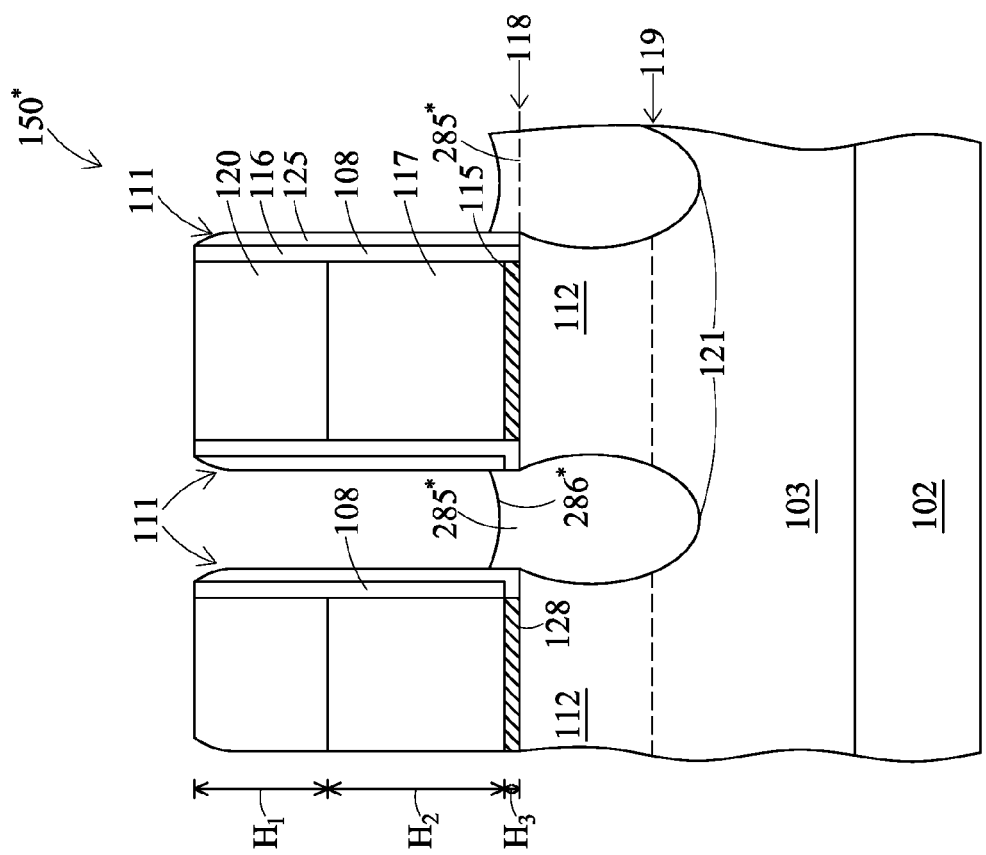
Fig. 5C
Fig. 5D

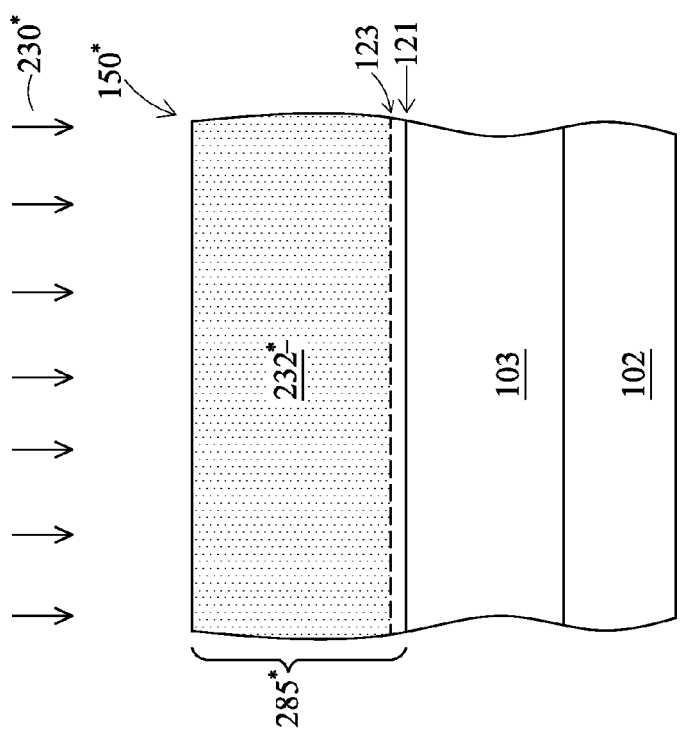
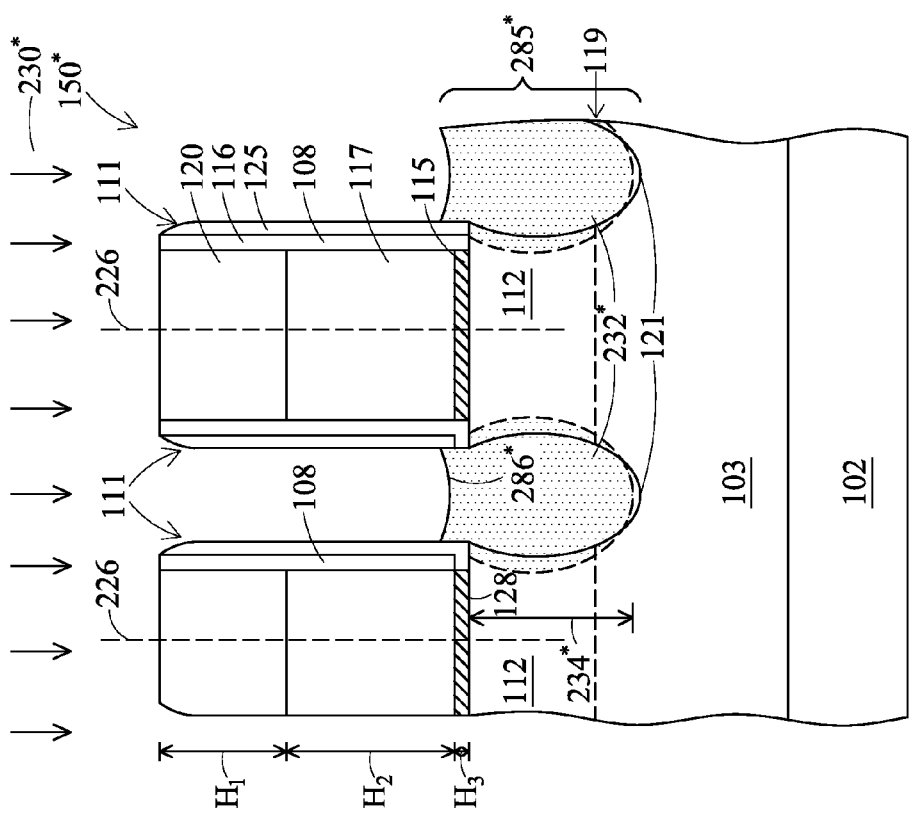

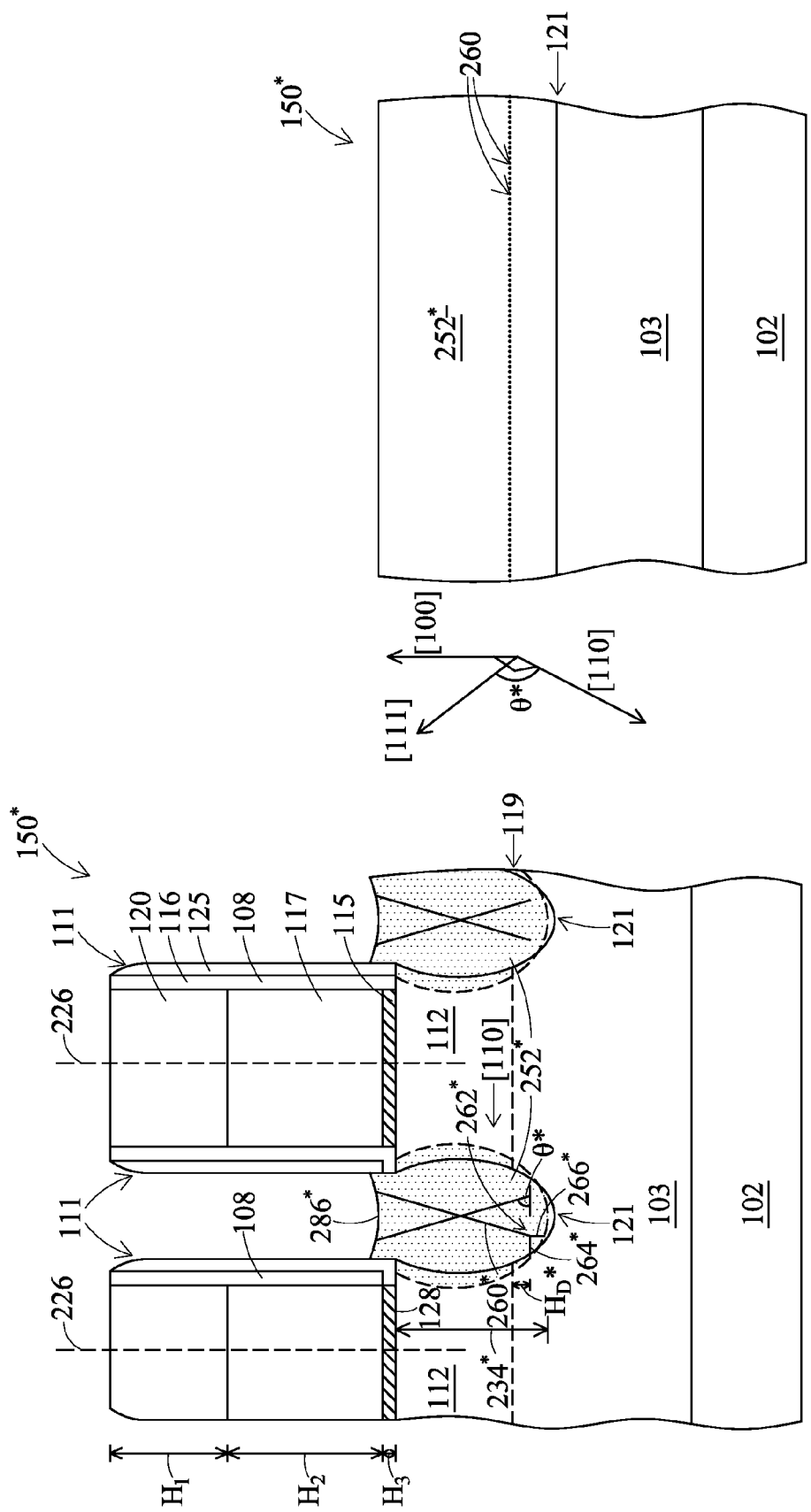

FORMATION OF DISLOCATIONS IN SOURCE AND DRAIN REGIONS OF FINFET DEVICES

CROSS-REFERENCES TO RELATED APPLICATIONS

The present application is related to U.S. application Ser. No. 13/912,903, entitled "Mechanisms for Doping Lightly Doped Drain (LDD) Regions of finFET Devices" and filed on Jun. 7, 2013, and U.S. application Ser. No. 13/829,770, entitled "Epitaxial Growth of Doped Film for Source and Drain Regions" and filed on Mar. 14, 2013. In addition, the present application is related to U.S. patent application Ser. No. 13/177,309, entitled "A Semiconductor Device with a Dislocation Structure and Method of Forming the Same" and filed on Jul. 6, 2011, and U.S. patent application Ser. No. 13/324,331, entitled "Mechanisms for Forming Stressor Regions in a Semiconductor Device" and filed on Dec. 13, 2011. Additionally, the present application is related to U.S. patent application Ser. No. 14/137,690, entitled "Mechanisms for FinFET Well Doping" and filed on Dec. 20, 2013. The above-mentioned applications are incorporate herein in their entireties.

BACKGROUND

The semiconductor integrated circuit (IC) industry has experienced rapid growth. Over the course of this growth, functional density of the devices has generally increased by the device feature size or geometry has decreased. This scaling down process generally provides benefits by increasing production efficiency, lowering costs, and/or improving performance. Such scaling down has also increased the complexities of processing and manufacturing ICs and, for these advances to be realized similar developments in IC fabrication are needed.

Likewise, the demand for increased performance and shrinking geometry from ICs has brought the introduction of multi-gate devices. These multi-gate devices include multi-gate fin-type field effect transistors, also referred to as finFET devices, so called because the channel is formed on a "fin" that extends from the substrate. FinFET devices may allow for shrinking the gate width of device while providing a gate on the sides and/or top of the fin including the channel region.

As semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Stress distorts or strains the semiconductor crystal lattice, which affects the band alignment and charge transport properties of the semiconductor. By controlling the magnitude and distribution of stress in a finished device, manufacturers can increase carrier mobility and improve device performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1A is perspective view of an embodiment of a semiconductor device structure, in accordance with some embodiments.

FIG. 1B shows a top view of a transistor region, in accordance with some embodiments.

FIGS. 3A-3H show cross-sectional views of the transistor region of the sequential process flow of FIG. 2, in accordance with some embodiments.

FIGS. 5A-5J show cross-sectional views of the transistor region of the sequential process flow of FIG. 4, in accordance with some embodiments.

DETAILED DESCRIPTION

Figure 2:
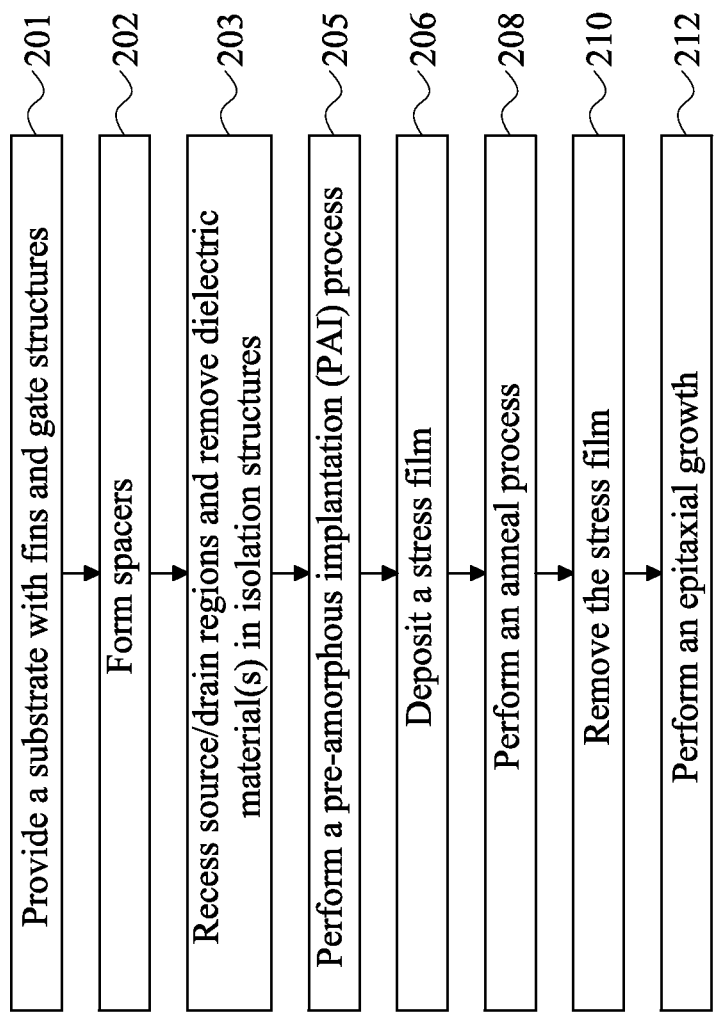
FIG. 2 shows a sequential process flow of forming dislocations in the source and drain regions of finFET devices, in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure may repeat reference numerals and/or letters in the various examples. This repetition is for the purpose of simplicity and clarity and does not in itself dictate a relationship between the various embodiments. It is understood that those skilled in the art will be able to devise various equivalents that, although not specifically described herein that embody the principles of the present disclosure.

It is also noted that the present disclosure presents embodiments in the form of multi-gate transistors or fin-type multi-gate transistors referred to herein as finFET devices. Such a device may include a p-type metal oxide semiconductor fin-FET device or an n-type metal-oxide-semiconductor (NMOS) finFET device. The finFET device may be a dual-gate device, tri-gate device, and/or other configuration. Fin-FET devices may be included in an IC such as a microprocessor, memory device, and/or other IC. One of ordinary skill may recognize other embodiments of semiconductor devices that may benefit from aspects of the present disclosure.

As described above, strained source/drain features (e.g., stressor regions) have been implemented to enhance carrier mobility and improve device performance. Stress distorts or strains the semiconductor crystal lattice, which affects the band alignment and charge transport properties of the semiconductor. By controlling the magnitude and distribution of stress in a finished device, manufacturers can increase carrier mobility and improve device performance. Dislocations in the source and drain regions strain the semiconductor crystalline lattice of the transistor regions. As a result, dislocations can be formed to improve carrier mobility and to improve device performance. The finFET devices have three-dimensional (3D) gate dielectric layer and use multiple fins to form source and drain regions. There are unique challenges in forming dislocations in the source and drain regions of finFET devices, which do not occur for planar devices.

Illustrated in FIG. 1A is perspective view of a semiconductor device structure 100, in accordance with some embodiments. The semiconductor device structure 100 includes finFET device structures. The semiconductor device structure 100 includes a substrate 102, a plurality of fins 104, a plurality of isolation structures 106, and a gate structure 108 disposed on each of the fins 104. The gate structure 108 may include a gate dielectric layer 115, a gate electrode layer 117, and/or one or more additional layers. A mask layer 120 is over the gate electrode layer 117. The hard mask layer 120 is used to pattern, such as by etching, the gate structure 108. In some embodiments, the hard mask layer 120 is made of a dielectric material, such as silicon oxide. The perspective view of FIG. 1A is taken after the patterning (or forming) process of gate structure 108. FIG. 1A shows only one gate structure 108. There are additional gate structure(s) (not shown) similar and parallel to the gate structure 108 shown in FIG. 1A. FIG. 1A shows two fins 104. In some embodiments, the number of fins 104 is in a range from 2 to 30.

Each of the plurality of fins 104 include a source region $110_S$ and a drain region $110_D$, where source or drain features are formed in, on, and/or surrounding the fin 104. A channel region 112 of the fin 104 underlies the gate structure 108. The channel region 112 of fin 104 has a length (gate length) L, and a width (gate width) W, as shown in FIG. 1A. In some embodiments, the length (gate length) L is in a range from about 10 nm to about 30 nm. In some embodiments, the width (gate width) W is in a range from about 10 nm to about 20 nm. The height (gate height) $H_G$ of gate structure 108, measured from the top of fin 104 to the top of gate structure 108, is in a range from about 50 nm to about 80 nm, in some embodiments. The height (fin height) $H_F$ of fin 104, measured from the surface of isolation structure 106 to the top of fin 104, is in a range from about 25 nm to about 35 nm, in some embodiments.

The substrate 102 may be a silicon substrate. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 102 is a semiconductor on insulator (SOI).

The isolation structures 106 is made of a dielectric material and may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures are STI features and are formed by etching trenches in the substrate 102. The trenches may then be filled with isolating material, followed by a chemical mechanical polish (CMP). Other fabrication techniques for the isolation structures 106 and/or the fin structure 104 are possible. The isolation structures 106 may include a multi-layer structure, for example, having one or more liner layers. The level 118 of top surfaces and the level 119 of bottom surfaces of isolation structures 106 are labeled in FIG. 1A.

The fins 104 may provide an active region where one or more devices are formed. In an embodiment, a channel region (112) of a transistor device is formed in the fin 104. The fins 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The fins 104 may be fabricated using suitable processes including photolithography and etch processes in a semiconductor layer 103, which is made of the same material as fins 104. Actually, fins 104 are formed by etching the semiconductor layer 103. In some embodiments, the semiconductor layer 103 is part of substrate 102. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms a recesses into isolation structures 106, leaving protruding fins. The recesses may be etched using reactive ion etch (RIE) and/or other suitable processes. Numerous other embodiments of methods to form the fins 104 on the substrate 102 may be suitable.

The gate structure 108 may include a gate dielectric layer 115, a gate electrode layer 117, and/or one or more additional layers. In an embodiment, the gate structure 108 is a sacrificial gate structure such as formed in a replacement gate process used to form a metal gate structure. In an embodiment, the gate structure 108 includes polysilicon layer (as the gate electrode layer 117).

The gate dielectric layer 115 of the gate structure 108 may include silicon dioxide. The silicon oxide may be formed by suitable oxidation and/or deposition methods. Alternatively, the gate dielectric layer of the gate structure 108 may include a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The high-k dielectric layer may be formed by atomic layer deposition (ALD) and/or other suitable methods.

In an embodiment, the gate structure 108 may be a metal gate structure. The metal gate structure may include interfacial layer(s), gate dielectric layer(s), work function layer(s), fill metal layer(s) and/or other suitable materials for a metal gate structure. In other embodiments, the metal gate structure 108 may further include capping layers etch stop layer, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the gate structure 108 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the gate structure 108 include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s)

may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate structure.

The semiconductor device structure 100 described above include fins 104 and gate structure 108. The semiconductor device structure 100 needs additional processing to form various features, such as lightly-doped-drain (LDD) regions and doped source/drain regions, of the transistor utilizing structure 100. LDD regions are next to channel regions and are under spacers. The term LDD regions are used to describe lightly doped regions next to both source and drain regions.

FIG. 1B shows a top view of a transistor region 150 formed with one of the fins 104 of FIG. 1A and taken on a surface leveled (118) with the top surface of isolation structure 106, in accordance with some embodiments. Transistor region 150 includes a source region $110_S$ and a drain region $110_D$.

Transistor region 150 also includes a channel region 112, which is part of fin 104 and is surrounded by gate structure 108 on 3 sides, as shown in FIG. 1A. The channel region 112 has a length (gate length) L and a width (gate width) W. Transistor region 150 also includes gate dielectric layer 115 and gate electrode layer 117. FIG. 1B shows LDD regions between source region $110_S$ and channel region 112, and between drain region $110_D$ and channel region 112. The LDD regions 113 has a width W and a length $L_S$, which is defined by the width of spacers 111. FIG. 1B shows another gate structure 108 by dotted lines. This other gate structure 108 has been described above as being similar and parallel to the gate structure 108 and is not shown in FIG. 1A. In some embodiments, Ls is in a range from about 5 nm to about 10 nm.

FIG. 2 shows a sequential process flow 200 of forming dislocations in the source and drain regions of finFET devices, in accordance with some embodiments. FIGS. 3A-3H show cross-sectional views of the transistor region of the sequential process flow of FIG. 2, in accordance with some embodiments. The processing sequence and structures described below are mainly for n-type finFET devices. However, at least portions of the embodiments described below may be applied for P-type finFET devices.

Process flow 200 begins at an operation 201 during which a substrate with fins and gate structures, such as the one shown in FIG. 1A, is provided. The substrate undergoes various processing sequences to form the structures, such as fins 104, isolation structures 106, and gate structure(s) 108. Spacers (not shown) are then formed at operation 202. The source and drain regions ($110_D$ and $110_S$) are recessed and the dielectric material(s) in isolation structures 106 between the source and drain regions are removed by etching afterwards at operation 203. However, the dielectric material of the isolation structure 106 under gate electric layer 117 and spacers 111 is not removed.

Process flow 200 continues to operation 205 in which a pre-amorphous implantation (PAI) process is performed on the substrate. The process flow 200 then continues to operation 206 in which a stress film is deposited on the substrate. Afterwards, an anneal process is performed on the substrate at operation 208. Dislocations are formed during the anneal process. As mentioned above, strained source/drain features (e.g., stressor regions) could been implemented to enhance carrier mobility and improve device performance. Details of the formation of dislocations will be described below. The stress film is removed at operation 210, if applicable. At operation 212, an epitaxial growth is performed on the substrate to form the source and drain regions. In some embodiments, operations 206 and 208 are not needed and the stress film is not deposited.

FIGS. 3A-3H are cross-sectional views of intermediate stages of forming source and drain regions of a finFET structure, in accordance with some embodiments. Spacers 111 are formed at operation 202, as described above. Spacers 111 may include a spacer layer (116), which is deposited to provide an offset. As a result, such a spacer layer may also be called an offset spacer layer 116. In some embodiments, the spacers 111 also include another spacer layer, which is called a main spacer layer 125. Offset spacer layer 116 has a thickness in a range from about 3 nm to about 10 nm, in some embodiments. Offset spacer layer 116 may be made of a dielectric material, such as silicon oxynitride (SiON), silicon nitride (SiN), or carbon-doped silicon nitride (SiCN), or carbon doped silicon Oxyntride (SiOCN). In some embodiments, an LDD doping is performed after offset spacer 116 is formed.

Main spacer layer has a thickness in a range from about 5 nm to about 10 nm, in some embodiments. Main spacer layer 125 is made of a dielectric material, such as silicon oxynitride (SiON), silicon nitride (SiN), or carbon-doped silicon nitride (SiCN). SiCN has relative low etch rate against etchants, such as $H_3PO_4$ and HF, in comparison to SiN or SiON. In some embodiments, the deposition process is a plasma-enhanced chemical vapor deposition (PECVD) process. Other applicable deposition process may also be used. In some embodiments, each of spacers 111 has a width in a range from about 5 nm to about 10 nm.

After spacers 111 are formed, the source and drain regions of n-type devices are recessed by etching at operation 203. One or more etching processes may be used to recess the source and drain regions. The etching process(es) may include a dry process(es), such as a plasma etching process, a wet etching process(es), or a combination of both. In some embodiments, a wet etch is used to form the recesses. For example, an etchant such as carbon tetrafluoride ($CF_4$), HF, tetramethylammonium hydroxide (TMAH), or combinations of thereof, or the like may be used to perform the wet etch and form the recesses. In some embodiments, a layer of SiN of about 50 angstroms thickness may be formed for recess proximity control.

Prior to recessing the source and drain regions of n-type devices, a photolithography process could be used to cover other regions, such as P-type device regions, on substrate 102, with photoresist to prevent etching. As a result, a resist removal process is needed after the etching process and before the next operation. Additional cleaning process could be used to ensure no residual resist remains on the substrate.

After the source and drain regions of n-type devices are recessed, the dielectric material in the isolation structures 106 neighboring the recessed source and drain regions is removed by etching to expose the semiconductor layer 103 below and surrounding the isolation structures 106. In some embodiment, the etching process is a plasma (dry) etching process. A photoresist patterning process is involved prior to the etching of the dielectric material in the isolation structures 106. The patterned photoresist layer protects regions not targeted for the removal of the dielectric material, such as P-type device regions and STI structures not neighboring source and drain regions for n-type devices. By removing isolation dielectric material in the isolation structures 106 (or removing isolation structures 106), there is additional areas for subsequent formation of dislocations in the source and drain regions, which would be described below. A resist removal process is needed after the etching process and before the next operation. Additional cleaning process could be used to ensure no residual resist remains on the substrate.

FIGS. 3A and 3B show cross-sectional views of transistor region 150 after recesses 127 are formed and after the dielectric material in the isolation structures 106 is removed and the fins 104 are recessed, in accordance with some embodiments. The dielectric material in the isolation structures 106 is removed and the fins 104 are recessed in operation 203 of FIG. 2, as described above. FIG. 3A shows two neighboring gate structures 108. As mentioned above, there are additional gate structure(s) similar and parallel to the gate structure 108 shown in FIG. 1A. FIG. 3A shows two neighboring gate structures 108 are formed over one of the fin 104 and are separated by recesses 127, which are formed by etching source/drain regions $110_D$ and $110_S$ of FIG. 1A. For simplicity of discussion, we designate recesses 127 as recessed drain region ($110_D$). Each gate structure 108 includes a gate electrode layer 117 and a gate dielectric layer 115. A hard mask layer 120 is formed over the gate electrode layer 117, in accordance with some embodiments. The hard mask layer 120 is used in assisting patterning of gate structures 108. In some embodiments, the thickness $H_1$ of hard mask layer 120 is in a range from about 70 nm to about 100 nm. The thickness $H_2$ of gate electrode layer 117 is in a range from about 80 nm to about 100 nm. The thickness $H_3$ of gate dielectric layer 115 is in a range from about 2 nm to about 3 nm. The channel length L as shown in FIG. 1B as equal to the width of gate electrode layer 117 of a gate structure 108. Channel regions 112, which are directly under the gate structures 108 are also noted in FIG. 3A. A dotted line 118 indicates the level of top surfaces of isolation structures 106 and another dotted line 119 indicates the level of bottom surfaces of isolation structures 106.

FIG. 3A also show spacers 111 formed next to the gate structures 108. Each spacer 111 includes an offset spacer layer 116 and a main spacer layer 125, in accordance with some embodiments. Between neighboring gate structures 108, there are recesses 127. The depth $H_R$ of recesses 127 below top surface (level 118) of isolation structures 106 is in a range from about 5 nm to about 20 nm, in some embodiments. The bottom surfaces 121 of recesses 127 are marked in FIG. 3A. The bottom surfaced 121 of recesses 127 are below the bottom surfaces of isolation structures (marked by level 119).

FIG. 3B shows a cross-sectional view of transistor region 150 according to the cut 132 illustrated in FIG. 1A, in accordance with some embodiments. FIG. 3B shows recess 127, which used to be occupied by fins 104 (marked as $104_O$) and isolation structures 106 (marked as $106_O$). The boundaries of fins 104 are marked by dotted lines 105. The dotted line 118 indicating the level of top surfaces of isolation structures 106 and dotted line 119 indicating the level of bottom surfaces of isolation structures 106 are also shown in FIG. 3B. The bottom surface 121 of recesses 127 is marked in FIG. 3A. The bottom surface 121 of recesses 127 is below the bottom surfaces of isolation structures (marked by level 119). FIG. 3B shows 2 fins 104 being removed. In some embodiments, the number of fins removed is in a range from 2 to 30.

Figure 3I:
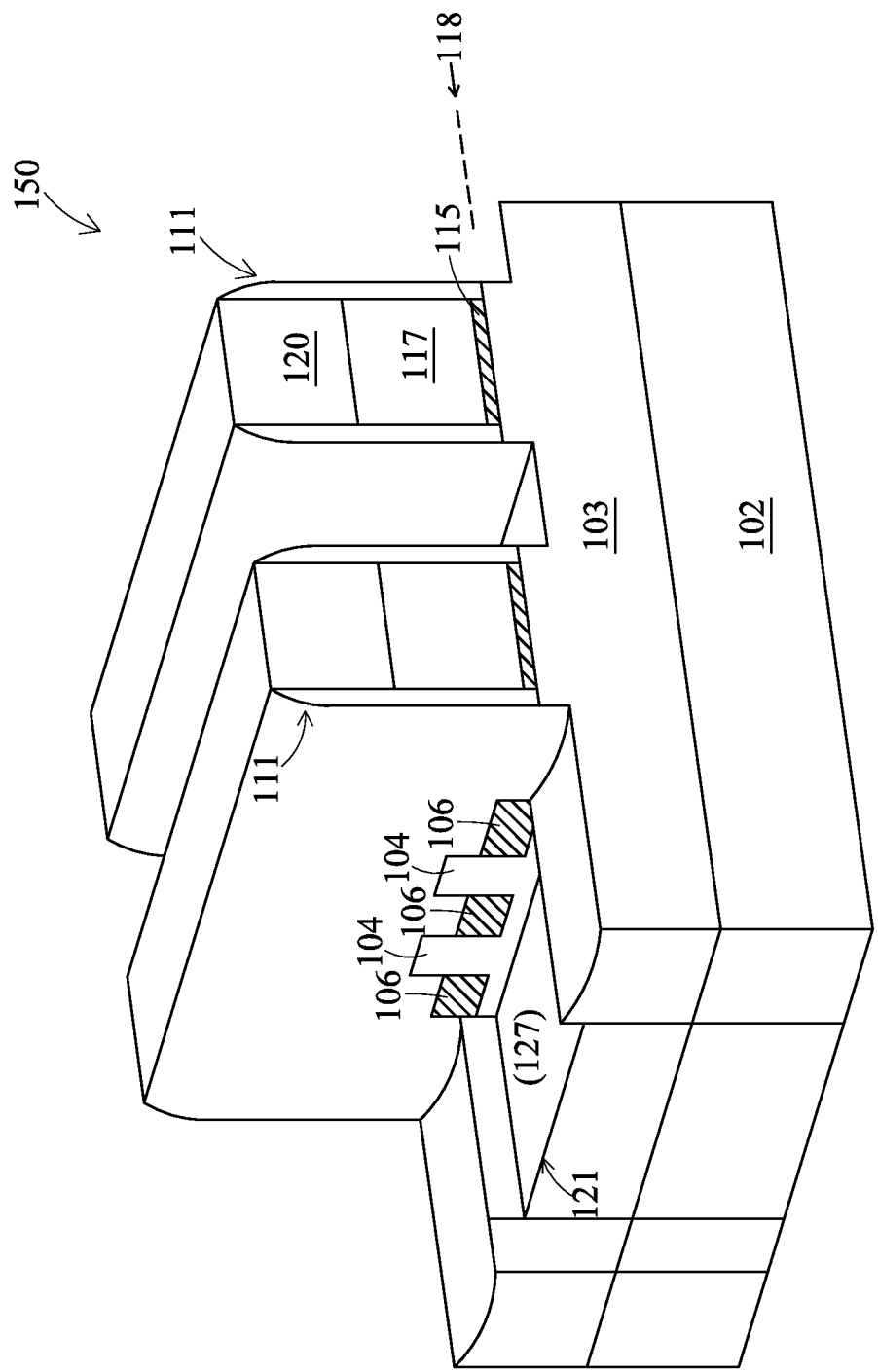
FIG. 3I shows a perspective view of the transistor region of FIGS. 3A and 3B, in accordance with some embodiments.

FIG. 3I shows a perspective view of transistor region 150 of FIGS. 3A and 3B, in accordance with some embodiments. FIG. 3I shows that fins 104 have been recessed. In addition, the dielectric material of neighboring isolation structures 106 has been removed and a portion of semiconductor layer 103 underneath the isolation structures 106 is also removed. Recess 127 includes the regions that used to be occupied by fins 104 and isolation structures 106. In addition, recess 127 also includes a portion of semiconductor layer 103 that has been etched. FIG. 3I also shows that portions of isolation structures 106 and fins 104 that are covered by spacer 111 are not removed and remain over substrate 102, because they are protected by spacer 111 during etching. FIG. 3I shows a bottom surface 121 of recess 127.

Referring to FIG. 2, a pre-amorphous implantation (PAI) process is performed at operation 205 afterwards. The PAI process 230 implants the exposed surface over substrate 102 with some species, as shown in FIGS. 3C and 3D in accordance with some embodiments. The implanted species damage the lattice structure of residual fins 104 and semiconductor layer 103 under openings $106_O$ to form an amorphized (or amorphous) regions 232. In some embodiments, the implanted species scatter in semiconductor layer 103. The scattered species cause lateral amorphization, which results in amorphized regions 232 extending to regions underneath the spacers 111. In some embodiments, the amorphized regions 232 are formed in a source and drain region of transistor region 150 and do not extend beyond the center line 226 of the gate structure 108. The amorphized region 232 has a depth 234 below a top surface 128, which is right next to gate dielectric layer 115, of semiconductor layer 103. The amorphized depth 234 is formed according to design specifications. In some embodiments, the amorphized depth 234 is in a range from about 15 nm to about 60 nm. In some embodiments, the amorphized depth 234 is less than about 100 nm.

FIG. 3D shows that the amorphized region 232 extends below openings $106_O$, which used to be filled with a dielectric material. By removing the dielectric material of the isolation structures 106, the semiconductor layer 103 underneath is exposed for amorphization. As a result, the amorphized region 232 is expanded in comparison to when the dielectric material of the isolation structures 106 is not removed. The expanded amorphized region 232 would assist in dislocation formation. Otherwise, the initiation of dislocations would be limited to fins 104. Studies show that dislocations might not form or extend as expected in planar devices. Details of formation of dislocations which will be described below.

In some embodiments, the amorphized depth 234 is controlled by the thickness of the gate spacers 111, because the gate spacers 111 serve to concentrate the PAI process 230 implantation energy away from the center line 226 of the gate structure 108, thereby allowing for a deeper amorphized depth 234. In addition, the amorphized depth 234 is controlled by parameters of the PAI process 230, such as implant energy, implant species, and implant dosage, etc. The PAI process 230 implants the substrate semiconductor layer 103 with silicon (Si) or germanium (Ge), in accordance with some embodiments. In some embodiments, other implant species heavier than Si are used. For example, in some embodiments, the PAI process 230 utilizes other implant species, such as Ar, Xe, As, P, In, other suitable implant species, or combinations thereof. In some embodiments, the PAI process 230 implants species at an implant energy in a range from about 20 KeV to about 40 KeV. In some embodiments, the PAI process 230 implants species at a dosage ranging in a range from about $7 \times 10^{14}$ atoms/cm$^2$ to about $1.5 \times 10^{15}$ atoms/cm$^2$, depending on the implantation temperature. Lower implantation temperature enhances implant amorphization efficiency. In some embodiments, the implant temperature is in a range from about $-100°$ C. to about $25°$ C. (or room temperature).

In some embodiments, a patterned photoresist layer is utilized to define where the amorphized region 232 is formed and protect other regions over substrate 102 from implantation damage. For example, the PMOS (p-type MOS) regions are protected. In addition, the patterned photoresist layer exposes the source/drain regions of n-type metal-oxide-semiconductor field effect transistor (NMOSFET) regions, such that the source/drain regions are exposed to the PAI process 230 (forming amorphized region 232). Alternatively, a patterned hard mask layer, such as a SiN or SiON layer, is utilized to define the amorphized region. In some embodiments, the patterned photoresist layer or the patterned hard mask layer is part of the current manufacturing process, for example lightly-doped drains (LDD) or source/drain formation, thereby minimizing cost as no additional photoresist layer or hard mask is required for the PAI process 230. After the PAI process is performed, the photoresist over substrate 102 is removed.

The process flow 200 then continues to an optional operation 206 in which a stress film is deposited on the substrate. Referring to FIGS. 3E and 3F, an optional stress film 240 is deposited over the substrate 102, in some embodiments. FIG. 3E shows that the stress film 240 is deposited over the gate structures 108 with spacers 111. In some embodiments, the stress film 240 is formed by atomic layer deposition (ALD), chemical vapor deposition (CVD), physical vapor deposition (PVD), high density plasma CVD (HDPCVD), other suitable methods, and/or combinations thereof. In some embodiments, the stress film 240 includes a dielectric material, such as silicon nitride, silicon oxide, silicon oxynitride, other suitable materials, and/or combinations thereof. The stress film 240 has tensile stress, which affects the recrystallization process. For example, the stress film 240 could retard the growth rate in the [110] crystalline direction of the source and drain regions. In some embodiments, the stress film 240 is not used. In some embodiments, the thickness of the stress film 240 is in a range from about 5 nm to about 20 nm. In some embodiments, the stress of film 240 is in a range from about 0.8 GPa to about 2.0 GPa. In some embodiments, the stress film 240 is tensile and provides compressive stress to the S/D regions.

Afterwards, an anneal process is performed on the substrate at operation 208. Still referring to FIGS. 3E and 3F, an annealing process 250 is performed on the substrate 102 at operation 208. The annealing process 250 causes the amorphized regions 232 to re-crystallize, forming stressor regions 252. This process is often referred to as solid-phase epitaxy regrowth (SPER), and thus, the stressor regions 252 are referred to as epi regions. The stressor regions 252 include epitaxial SiP, epitaxial SiC, epitaxial SiCP or epitaxial Si, or a combination thereof, in accordance with some embodiments. SiC stands for carbon-containing silicon and SiCP stands for carbon-and-phosphorous-containing silicon. In some embodiments, the carbon concentration is less than about 3 atomic %. In some embodiments, the P concentration is in a range from about 5E19 1/cm$^3$ to about 5E21 1/cm$^3$. The dopants of the stressor regions are doped in the layer(s) during deposition (or doped in-situ). In some embodiments, stressor regions 252 include epitaxial layers with different dopants. In some embodiments, the epitaxial layers include a SiP layer with the P concentration is in a range from about 1E20 1/cm$^3$ to about 7E20 1/cm$^3$ with a thickness in a range from about 4 nm to about 10 nm over another SiP layer the P concentration is in a range from about 1E21 1/cm$^3$ to about 3E2 1/cm$^3$. In some embodiments, the epitaxial layers include a SiCP layer with a thickness in a range from about 4 nm to about 10 nm and the C concentration less than about 1% and the P concentration is in a range from about 1E20 1/cm$^3$ to about 7E20 1/cm$^3$ over another a SiP layer the P concentration is in a range from about 1E21 1/cm$^3$ to about 3E2 1/cm$^3$. In some embodiments, the surface layer of the stress regions 252 is a Si layer to prevent the loss of P during subsequent processing.

In some embodiments, carbon is doped into a silicon film to create a SiC stressor, which is compressive and applies a tensile strain to the n-type metal-oxide-semiconductor (NMOS) transistor channel region due to the small size of carbon (C) in comparison to silicon (Si). In addition, in some embodiments, the compressive film stress in the stressor regions assists the initiation of pinchoff. In some embodiments, P is doped to lower the resistance of the source and drain regions. Carbon could be added to impede the out-diffusion of P.

In some embodiments, the annealing process 250 is a microwave annealing (MWA) process, a rapid thermal annealing (RTA) process, a millisecond thermal annealing (MSA) process (for example, a millisecond laser thermal annealing process), or a micro-second thermal annealing (OA) process. In some embodiments, the annealing process includes a pre-heat operation which minimizes or even eliminates end of range (EOR) defects, which are the remained defects at the amorphous/crystalline interface. The pre-heat operation is performed at a temperature from about 200° C. to about 700° C., in accordance with some embodiments. The pre-heat operation is performed in a range from about 10 seconds to about 10 minutes, in some embodiments.

For advanced device manufacturing that prohibits high temperature processing at this process operation, a MWA process may be used for the main anneal. MWA process can be tuned to locally increase temperature of a particular structure, layer, or region, such as amorphized regions 232, to a much higher value than the substrate or other surrounding structures, layers, or regions. For example, the amorphized regions 232 have dopants and crystalline structures that are different from the surrounding semiconductor layer 103 and substrate 102. As a result, the amorphized region 232 could be heated up to a higher temperature than semiconductor layer 103 and substrate 102 by microwave. The local higher temperature may be caused by electronic polarization and/or interfacial polarization mechanism under microwave. The local temperature of the targeted layer is higher than the substrate. In some embodiments, the temperature difference is in a range from about 200° C. to about 500° C. As a result, the temperature (measured on the substrate) of the MWA can be set at a lower value. In some embodiments, the MWA process is in a range from about 400° C. to about 600° C. In some embodiments, the substrate temperature is in a range from about 300° C. to about 500° C. during the 1$^{st}$ period with the electronic polarization mechanism. In some embodiments, the substrate temperature is in a range from about 500° C. to about 600° C. during the 2$^{nd}$ period with the interfacial polarization mechanism. The duration of the MWA process is in a range from about 1 min to about 3 minutes, in some embodiments. If MWA process is used, the temperature of the pre-heat operation is maintained to be in a range that meets the requirement of the manufacturing process.

Alternatively, there are other types of annealing processes. In some embodiments, the main anneal of the annealing process 250 is performed at a temperature in a range from about 800° C. to about 1,400° C. Depending on the type of annealing process and the temperature utilized, the main anneal of the annealing process 250 is performed for a duration in a range from about 1 millisecond to about 5 hours, in some embodiments. For example, the pre-heat operation is at a temperature of about 550° C. for about 180 seconds. If the annealing process 250 is a RTA process, in some embodiments, the main anneal temperature is equal to or greater than about 950° C. and is performed for a duration in a range from about 0.5 second to about 5 seconds, in some embodiments. If the annealing process 250 is a MSA process, in some embodiments, the main anneal temperature is up to a Si melting point of about 1,400° C. and is performed for a few milliseconds or less, for example for about 0.8 milliseconds to about 100 milliseconds.

During the annealing process 250, as the stressor regions 252 recrystallize, dislocations 260 are formed in the stressor regions 252. As described above, FIG. 3B shows a cross-sectional view of transistor region 150 according to the cut 132 illustrated in FIG. 1A. FIG. 3F shows a cross-sectional view derived from FIG. 3B. The exposed surface of semiconductor layer 103 of FIG. 3F (parallel to cut 132 or parallel to cut 131) has a [100] crystalline orientation and the crystalline orientation of semiconductor layer 103p perpendicular to cut 132 is [110], as shown in FIG. 3F in accordance with some embodiments. As described above in FIG. 3D, the semiconductor layer 103 underneath is exposed for amorphization, by removing the dielectric material of the isolation structures 106. As a result, the amorphized regions 232 are expanded in comparison to when the dielectric material of the isolation structures 106 is not removed. During the anneal process 250, the expanded amorphized regions 232 increase the sizes of the regions for starting dislocations (or pinchoff points 262). In some embodiments, the dislocations 260 are formed in the [111] direction. In some embodiments, the [111] direction has an angle 8 in a range from about 45 to about 65 degrees, with the angle being measured with respect to [110], which is parallel to the top surface 128 of the semiconductor layer 103 (or surface of substrate 102), as shown in FIGS. 3E and 3F. The exposed surface of semiconductor layer 103 of FIG. 3E (parallel to cut 131) has a crystalline orientation of [110]. Pinchoff points 262 are below the bottom surfaces 121 of recesses 127.

The dislocations 260 start formation at pinchoff points 262. In some embodiments, the pinchoff points 262 are formed in the stressor regions 252 at depths $H_D$ in a range from about 10 nm to about 30 nm, with the depths $H_D$ being measured from the bottom surface 119 of isolation structure 106. The pinchoff points 262 have a horizontal buffer 264 and a vertical buffer 266. The horizontal buffer 264 and the vertical buffer 266 are measured from the boundaries of amorphized regions 232 and are marked by dotted lines in FIGS. 3C, 3D, 3E and 3F. The horizontal buffer 264 and the vertical buffer 266 are formed according to design specifications and are affected by the annealing process 250. The pinchoff points 262 have a horizontal buffer 264 in a range from about 8 nm to about 38 nm and a vertical buffer 266 in a range from about 10 nm to about 40 nm, in some embodiments. In some embodiments, the pinchoff points 262 are formed such that the pinchoff points 262 are not disposed within the channel region. FIG. 3F shows the cross-sectional view of dislocations 260, which are represented by dots and are below bottom surface 121.

After the annealing process 250, the stress film 240 is removed at operation 210, as described above for FIG. 2. In some embodiments, at least a portion of each gate spacer 111 of NMOS devices is also removed. The stress film 240 and the removed portions of gate spacers 111 are removed by an etching process. In some embodiments, the etching process is performed by wet etching, such as by using phosphoric acid or hydrofluoric acid, or by a combination of dry etching and wet etching. In some embodiments, the process sequence of performing PAI process, formation of stress film, annealing, and removal of stress film described above are repeated a number of times to create multiple dislocations. Further details of multiple dislocations in the stress regions 252 are found in U.S. patent application Ser. No. 13/177,309, entitled "A Semiconductor Device with a Dislocation Structure and Method of Forming the Same" and filed on Jul. 6, 2011, which is incorporated herein by reference in its entirety.

Afterwards, a silicon-containing epitaxial structure 285 is formed in each of the recesses 127, as shown in FIGS. 3G and 3H, at operation 212 of FIG. 2 to form source and drain regions, in accordance with some embodiments. The silicon-containing epitaxial structures 285 are used as the source and drain structures for devices in transistor region 150. The silicon-containing structure 285 is formed by performing an epitaxial deposition process to form a silicon-containing epitaxial material, in some embodiments. In some embodiments, the silicon-containing epitaxial material (stress-inducing material) includes SiC, SiCP, SiP or other material that produces tensile strain on the transistor channel region. In some embodiments, the silicon-containing material is formed by using a silicon-containing precursor. For example, in some embodiments, gases, such as silane ($SiH_4$), disilane ($S_{i2}H_6$), trisilane ($S_{i3}H_8$), dichlorosilane ($SiH_2Cl_2$), etc., are used to form SiC-containing epitaxial material in structure 285. In some embodiments, phosphorous-containing gas, such as phosphine ($PH_3$), is used to form SiP epitaxial material or to form SiCP with a carbon-containing gas. In other embodiments forming P-type transistors, the silicon-containing epitaxial material includes any material, such as SiGe, that produces compressive strain on the transistor channel region.

In some embodiments, the surfaces 286 of the silicon-containing epitaxial structure 285 are concave and are at about the same level with or higher the surface 128 of semiconductor layer 103 and the gate structure 108. Surfaces 286 are concave due to difference in growth rate between [100] and [111] crystalline orientations. In some embodiments, the surface 286 has a height of up to about 30 nm above the substrate surface 223. Since the silicon-containing epitaxial structures 285 are also epitaxial, the dislocations 260 continue in structures 285, as shown in FIG. 3G, in accordance with some embodiments. With the growth of dislocations 260, epitaxial structures 285 become part of stressor regions 252, which are source and drain regions.

Figure 3J:
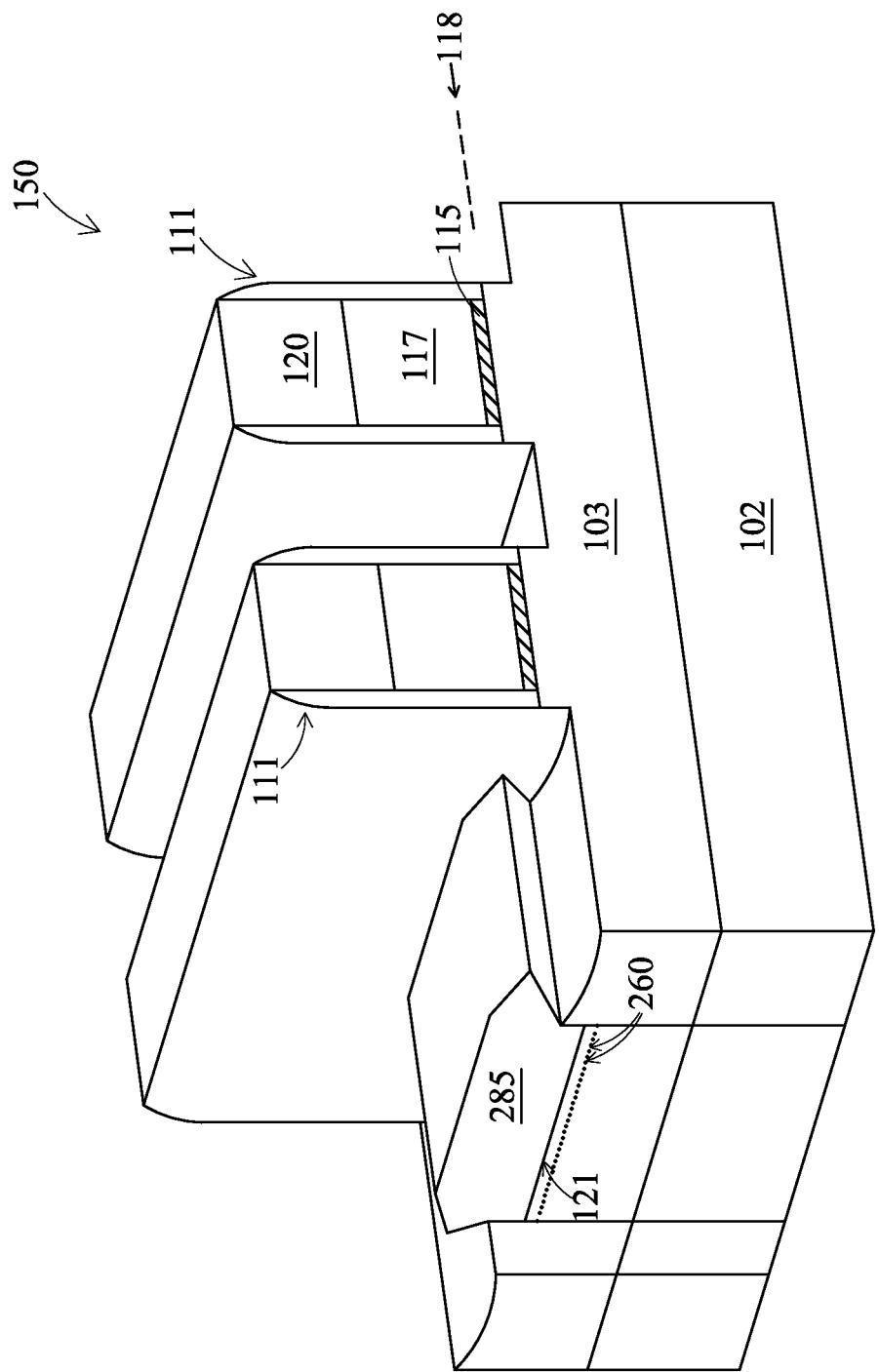
FIG. 3J shows a perspective view of the transistor region of FIGS. 3G and 3H, in accordance with some embodiments.

FIG. 3J shows a perspective view of transistor region 150 of FIGS. 3G and 3H, in accordance with some embodiments. FIG. 3J shows that the silicon-containing epitaxial structure 285 is formed in recess 127 of FIG. 3I. Portions of epitaxial structure 285 protrude over the neighboring semiconductor layer 103. The bottom surface 121 of recess 127 is also noted in FIG. 3J. FIG. 3J also shows the cross-sectional view of dislocations 262, which are represented by dots and are below bottom surface 121.

In some embodiments, the silicon-containing epitaxial material is formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD, molecular beam epitaxy (MBE) process, any suitable epitaxial process; or any combinations thereof. In some embodiments, the deposition of the silicon-containing epitaxial material has a deposition temperature of about 750° C. or less. In other embodiments, the etching temperature ranges from about 500° C. to about 750° C. In some embodiments, the pressure of the deposition process ranges from about 50 Torr to about 600 Torr.

Alternatively, the silicon-containing epitaxial material is formed by performing a cyclic deposition and etch process to form a silicon-containing epitaxial material. Details of an exemplary process are described in U.S. patent application Ser. No. 13/029,378, entitled "Integrated Circuits and Fabrication Methods Thereof" and filed on Feb. 17, 2011. The above-mentioned application is incorporated herein by reference in their entirety.

Afterwards, substrate 102 undergoes further CMOS or MOS technology processing to form various features to complete forming the device structures and interconnect in device region 150. In an embodiment, the gate stack contains polysilicon in the final device. In another embodiment, a gate replacement process (or gate last process) is performed, where the gate electrode 117 is replaced with a metal gate. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In some embodiments, subsequent processing further forms various contacts/vias/lines and multilayer interconnect features (e.g., metal layers and interlayer dielectrics) over substrate 102, configured to connect the various features or structures. In some embodiments, the additional features provide electrical interconnection to the device. For example, a multilayer interconnection includes vertical interconnects, such as conventional vias or contacts, and horizontal interconnects, such as metal lines. In some embodiments, the various interconnection features implement various conductive materials including copper, tungsten, and/or silicide. In one example, a damascene and/or dual damascene process is used to form a copper related multilayer interconnection structure.

The mechanism for forming dislocations in the source and drain regions described above in FIG. 3A-3H enables consistent and reliable formation of dislocations to exert tensile stress in the channel regions.

Figure 4:
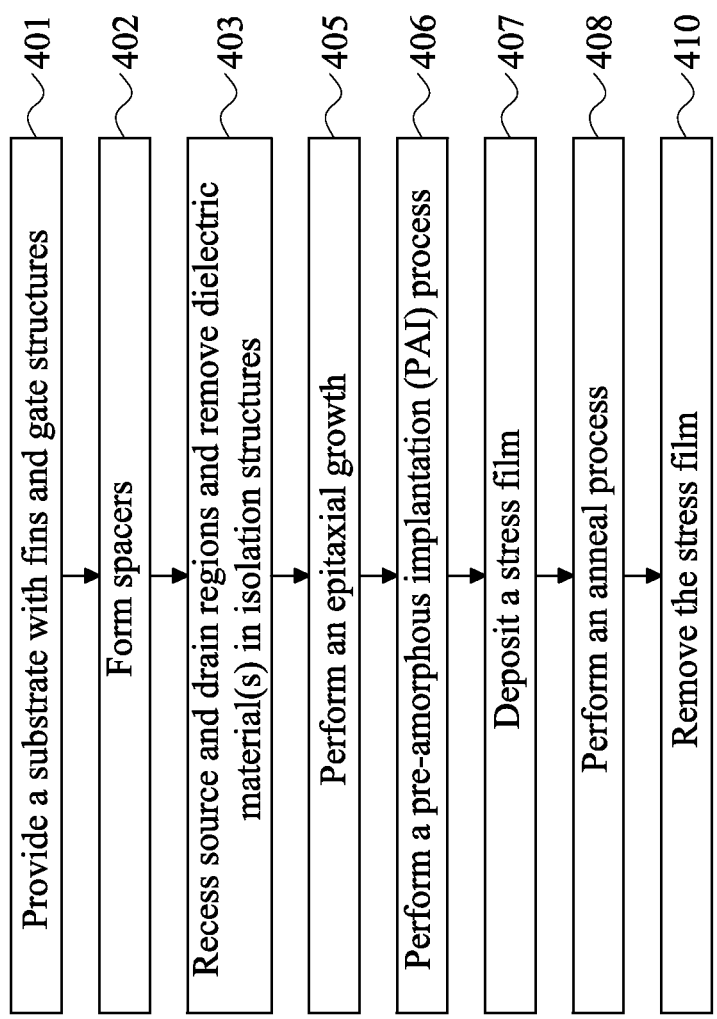
FIG. 4 shows a sequential process flow of forming dislocations in the source and drain regions of finFET devices, in accordance with some embodiments.

The process flow 200 of FIG. 2 performs PAI (operation 205) prior to epitaxial grown (operation 212). Alternatively, dislocations in the source and drain regions may be formed by different flows. FIG. 4 shows a sequential process flow 400 of forming dislocations in the source and drain regions of finFET devices, in accordance with some embodiments. FIGS. 5A-5J show cross-sectional views of the transistor region of the sequential process flow of FIG. 2, in accordance with some embodiments. The processing sequence and structures described below are mainly for n-type finFET devices. However, at least portions of the embodiments described below may be applied for P-type finFET devices.

Process flow 400 begins at an operation 401 during which a substrate with fins and gate structures, such as the one shown in FIG. 1A, is provided. Operation 401 is similar to operation 201 and structures provided in operation 401 are similar to those of operation 201. Spacers (not shown) are then formed at operation 402. The source and drain regions ($110_D$ and $110_S$) are recessed and the isolation structures 106 between the source and drain regions are then removed to expose semiconductor layer 103 by etching at operation 403. Operations 402 and 403 are similar to operations 202 and 203, respectively.

Process flow 400 continues to operation 405 in which an epitaxial growth is performed on the substrate to form the source and drain regions. The process flow then continues to operation 406 in which a pre-amorphous implantation (PAI) process is performed on the substrate. The process flow 200 then continues to an operation 407 in which a stress film is deposited on the substrate. Afterwards, an anneal process is performed on the substrate at operation 408. The stress film is removed at operation 410. Process flow 400 performs the epitaxial growth of the source and drain regions prior to performing the PAI process. As a result, the dislocations formed would be closer to the surface (128) of the semiconductor layer 103 than process flow 200. The locations of pinchoff points, such as 262, affect the tensile stress applied on to the fin channels.

Figures 5G, 5H:
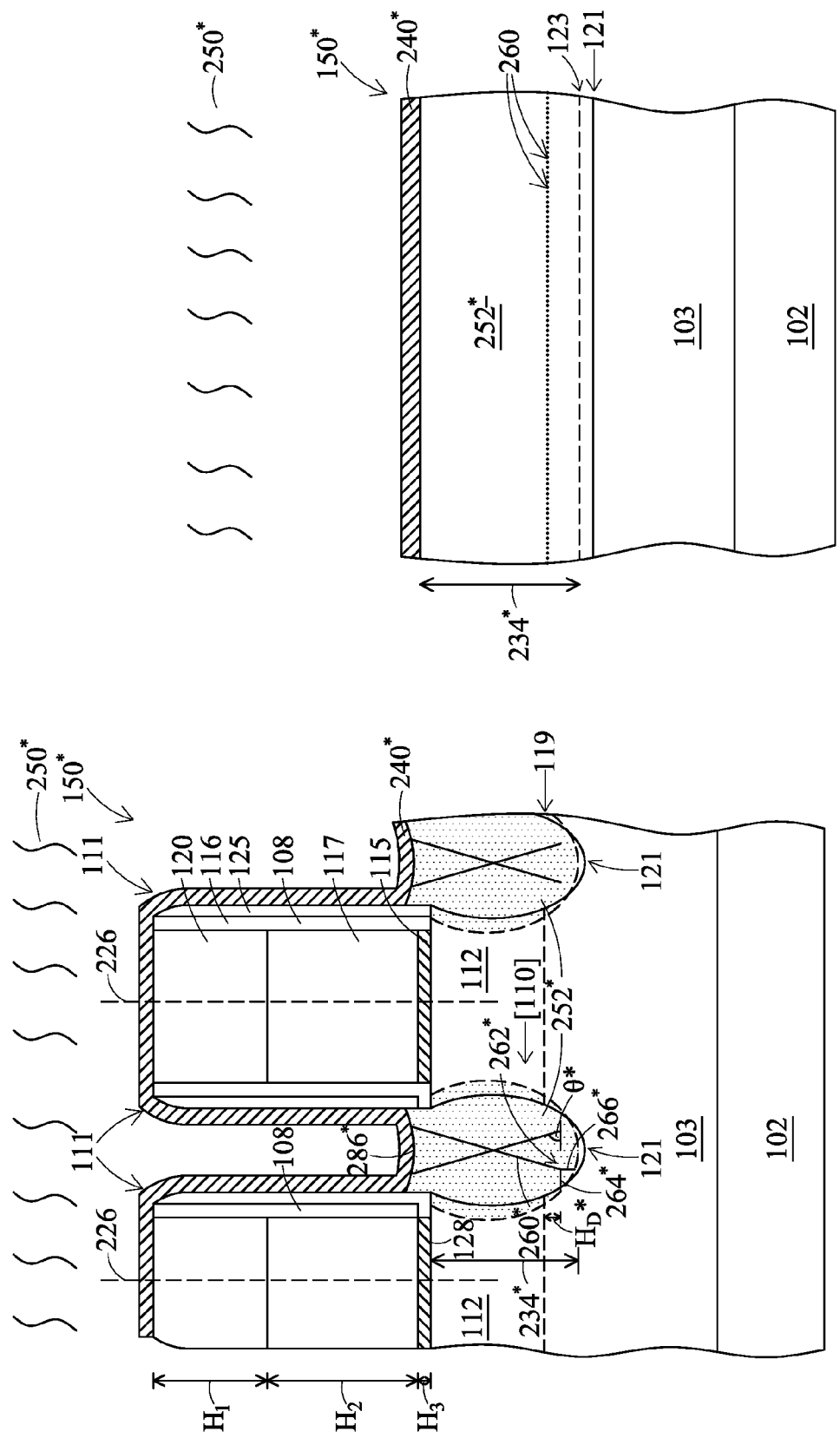

FIGS. 5A-5J are cross-sectional views of intermediate stages of forming source and drain regions of a finFET structure, in accordance with some embodiments. Since operations 401, 402, and 403 are similar to operations 201, 202, and 203 respectively, FIGS. 5A-5B are similar to FIGS. 3A-3B respectively, the description for FIGS. 5A-5B can be referred to description for FIGS. 3A-3B.

Referring to FIG. 4, an epitaxial growth is performed on the substrate to form the source and drain regions at operation 405 after operation 404 is completed. The epitaxial growth forms silicon-containing epitaxial structures 285*, which are used as the source and drain structures for devices in transistor region 150*. The silicon-containing structures 285* are formed by performing an epitaxial deposition process to form a silicon-containing epitaxial material, in some embodiments. The silicon-containing epitaxial material of the silicon-containing structures 285* is similar to the material of silicon-containing epitaxial structures 285 described above in FIGS. 3G and 3H. However, dislocations in the epitaxial structures 285* designed to stress the source and drain regions have not been formed yet.

In some embodiments, the surface 286* of the silicon-containing epitaxial structure 285* is level with or higher than the surface 128 of semiconductor layer 103 and the gate structure 108. In some embodiments, the surface 286* has a height of up to about 30 nm above surface 108.

Referring to FIG. 4, a pre-amorphous implantation (PAI) process is performed at operation 406 after operation 405 is completed. The PAI process 230* implants the exposed surface over substrate 102 with some species, as shown in FIGS. 5E and 5F in accordance with some embodiments. The implanted species damage the lattice structure of the silicon-containing structures 285* and portions of semiconductor layer 103 neighboring the silicon-containing structures 285*. In some embodiments, the implanted species scatter in semiconductor layer 103. The scattered species cause lateral amorphization, which results in amorphized region 232* (with boundaries in dotted lines near the boundaries of structures 285*) extending to regions underneath the spacers 111. The amorphized regions 232* are formed in a source and drain regions in transistor region 150* and does not extend beyond the center line 226 of the gate structure 108. The amorphized region 232* has a depth 234* below the top surface 118 of the original isolation structure 106. The depth 234* is formed according to design specifications. In some embodiments, the distance 234* is in a range from about 30 nm to about 50 nm. In some embodiments, the amorphized depth 234* is less than about 60 nm. PAI process 230* and implant dosage range are similar to PAI process 230 described above, in some embodiments. The bottom surface of amorphized region 232* is marked by a dotted line 123 in FIG. 5F, in accordance with some embodiments.

The process flow 400 then continues to an optional operation 407 in which a stress film is deposited on the substrate. Referring to FIGS. 5G and 5H, a stress film 240* is deposited over the substrate 102, in some embodiments. FIG. 5G shows that the stress film 240* is deposited over the gate structures 108 with spacers 111. Stress film 240* is similar to stress film 240 described above.

Afterwards, an anneal process is performed on the substrate at operation 408. Referring to FIGS. 5G and 5H, an annealing process 250* is performed on the substrate 102 at operation 408. The annealing process 250* causes the amorphized regions 232* to re-crystallize, forming stressor regions 252*. This process is often referred to as solid-phase epitaxial regrowth (SPER), and thus, the stressor regions 252* are referred to as epi regions. The annealing process 250* is similar to annealing process 250 described above. The stressor regions 252* are amorphized regions 232* after they are re-crystallized and the dislocations are formed. Since PAI process 230* is performed after the silicon-containing epitaxial structures 285* are formed, the depths 234* of stressor regions 252* (or amorphized regions 232*) are lower than depth 234 of stressor regions 252 (or amorphized regions 232) of FIGS. 5E and 5G.

As described above, the semiconductor layer 103 underneath is exposed for amorphization, by removing the dielectric material of the isolation structures 106. Similar to amorphized regions 232, the amorphized regions 232* are expanded in comparison to when the dielectric material of the isolation structures 106 are not removed. During the anneal process 250*, the expanded amorphized regions 232* increase the sizes of regions for starting dislocations 262*. In some embodiments, the dislocations 260* are formed in the [111] direction. In some embodiments, the [111] direction has an angle θ* in a range from about 45 to about 65 degrees, with the angle being measured with respect to [110], as shown in FIG. 5G.

The dislocations 260* start formation at pinchoff points 262*. In some embodiments, the pinchoff points 262* are formed in the stressor regions 252* at depths $H_D$* in a range from about 5 nm to about 20 nm, the depths $H_D$* being measured from the bottom surface 119 of isolation structure 106. Since PAI process 230* is performed after the silicon-containing epitaxial structures 285* are formed, the depths 234* of stressor regions 252* (or amorphized regions 232*) are lower than depth 234 of stressor regions 252 (or amorphized regions 232) of FIGS. 5E and 5G. As a result, the depths $H_D$* of dislocations 260* are lower than the depths $H_D$ of dislocations 260 described above.

Figure 5K:
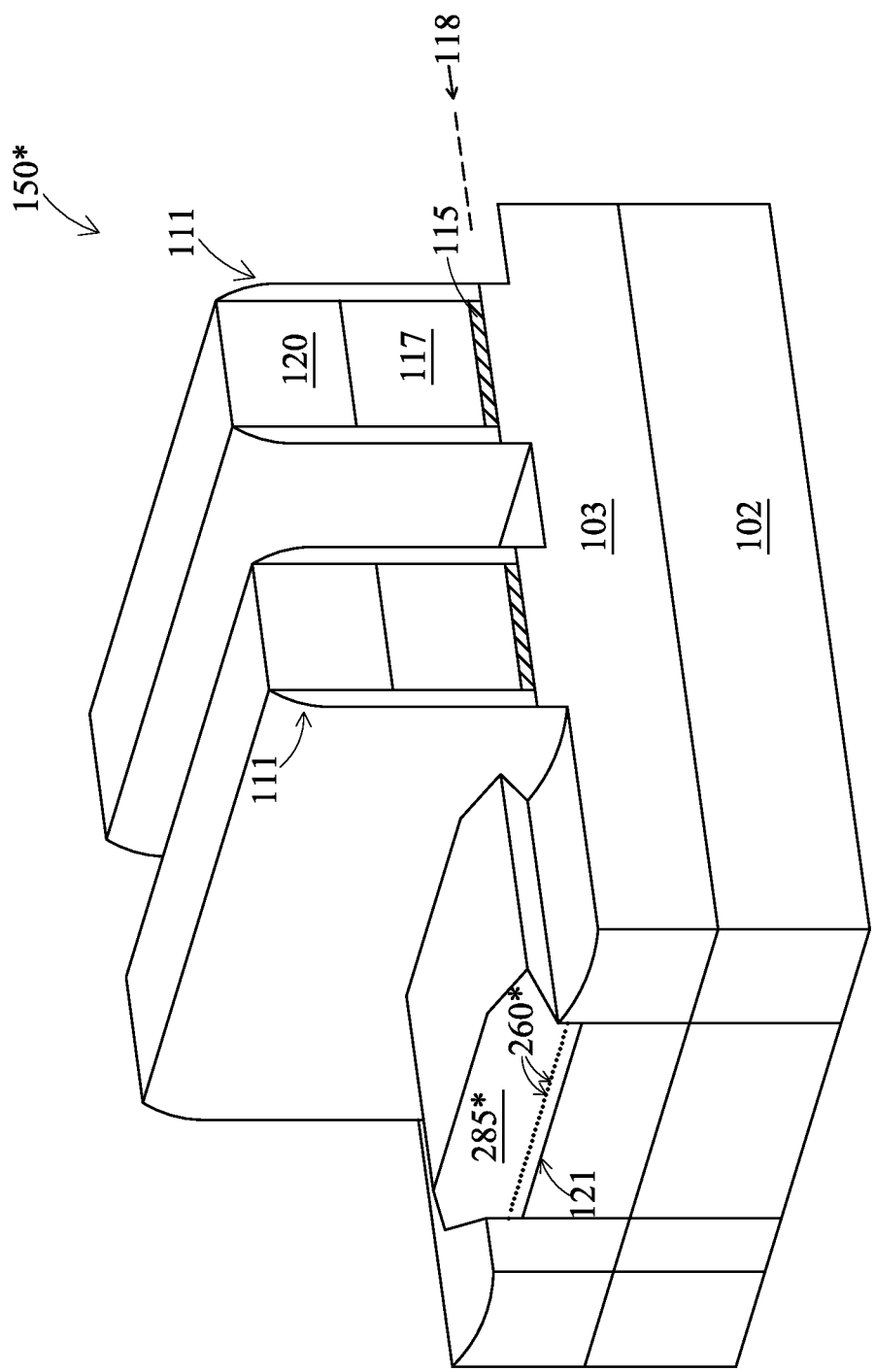
FIG. 5K shows a perspective view of the transistor region of FIGS. 5I and 5J, in accordance with some embodiments.

FIG. 5K shows a perspective view of transistor region 150* of FIGS. 5I and 5J, in accordance with some embodiments. FIG. 5K shows that the silicon-containing epitaxial structure 285* is formed in recess 127 of FIG. 3I, which is also a perspective view of FIGS. 5A and 5B. Portions of epitaxial structure 285* protrude over the neighboring semiconductor layer 103. The bottom surface 121 of recess 127 is also noted in FIG. 5K. FIG. 5K also shows the cross-sectional view of dislocations 262*, which are represented by dots and are above bottom surface 121.

The pinchoff points 262* have a horizontal buffer 264* and a vertical buffer 266*. The horizontal buffer 264* and the vertical buffer 266* are formed according to design specifications and are affected by the annealing process 250*. The pinchoff points 262* have a horizontal buffer 264* in a range from about 8 nm to about 38 nm and a vertical buffer 266* in a range from about 10 nm to about 40 nm, in some embodiments. In some embodiments, the pinchoff points 262* are formed such that the pinchoff points 262* are not disposed within the channel region.

After the annealing process 250*, the stress film 240* is removed at operation 410, as described above for FIG. 4 and as shown in FIGS. 5I and 5J, in accordance with some embodiments. In some embodiments, at least a portion of each gate spacer 111 of NMOS devices is also removed. The stress film 240* and the removed portions of gate spacers 111 are removed by an etching process. In some embodiments, the etching process is performed by wet etching, such as by using phosphoric acid or hydrofluoric acid, or by dry etching using suitable etchant. In some embodiments, the process sequence of performing PAI process, formation of stress film, annealing, and removal of stress film described above are repeated a number of times to create multiple dislocations. Further details of multiple dislocations in the stress regions 252 are found in U.S. patent application Ser. No. 13/177,309, entitled "A Semiconductor Device with a Dislocation Structure and Method of Forming the Same" and filed on Jul. 6, 2011, which is incorporated herein by reference in its entirety.

Afterwards, substrate 102 undergoes further CMOS or MOS technology processing to form various features to complete forming the device structures and interconnect of device region 150* in a manner similar to device region 150. The mechanism for forming dislocations in the source and drain regions described above in FIGS. 5A-5J also enables consistent and reliable formation of dislocations to exert tensile stress in the channel regions.

Dislocations 260 or 260* described above strain source/drain regions (or forming stressor regions). They are formed in the source and regions to enhance carrier mobility and improve device performance. The finFET devices have three-dimensional (3D) gate dielectric layer and use multiple fins to form source and drain regions. The fins have limited crystalline regions for forming dislocation. By removing the dielectric material in the isolation structures 106 surrounding fins 104, the crystalline regions for forming dislocations are increased. As a result, dislocations in the stressor regions (or source and drain regions) can form consistently to produce targeted strain in the source and drain regions to improve carrier mobility and device performance for NMOS.

The embodiments of mechanisms for forming dislocations in the source and drain regions described above in FIGS. 3A-3H and FIGS. 5A-5J both enable consistent and reliable formation of dislocations to exert tensile stress in the channel regions. The consistent and reliable formation of dislocations is achieved by recessing fins and by removing the isolation structures between fins to increase the regions to form dislocations. Without removing the isolation structures between fins, the regions allowed for forming dislocations are limited to the fin regions, which are more limited and could limit the generation of dislocations. By using the mechanisms described above, the NMOS finFET devices could improve on current (Ion) in a range from about 5% to about 20% in some embodiments.

Embodiments of mechanisms for forming dislocations in source and drain regions of finFET devices are provided. The mechanisms involve recessing fins and removing the dielectric material in the isolation structures neighboring fins to increase epitaxial regions for dislocation formation. The mechanisms also involve performing a pre-amorphous implantation (PAI) process either before or after the epitaxial growth in the recessed source and drain regions. An anneal process after the PAI process enables consistent growth of the dislocations in the source and drain regions. The dislocations in the source and drain regions (or stressor regions) can form consistently to produce targeted strain in the source and drain regions to improve carrier mobility and device performance for NMOS devices.

In some embodiments, a semiconductor device is provided. The semiconductor device includes a substrate having a fin-type field-effect-transistor (finFET) region. The semiconductor device also includes two neighboring gate structures formed over two neighboring fin structures, and the two neighboring fin structures contain a crystalline silicon-containing material. Portions of the two neighboring fin structures protrude above neighboring isolation structures. The semiconductor device further includes source and drain regions for both of the two neighboring gate structures, and there are dislocations in the source and drain regions to strain the source and drain regions.

In some other embodiments, a semiconductor device is provided. The semiconductor device includes a substrate having a fin-type field-effect-transistor (finFET) region, and two neighboring gate structures formed over two neighboring fin structures. The two neighboring fin structures contain a crystalline silicon-containing material, and portions of the two neighboring fin structures protrude above neighboring isolation structures. The semiconductor device also includes source and drain regions for both of the two neighboring gate structures, and there are dislocations in the source and drain regions to strain the source and drain regions. The source and drain regions extends to neighbor the isolation structures between the two neighboring gate structures, and there is no isolation structures in the source and drain regions.

In yet some other embodiments, a method of forming a fin-type field-effect-transistor (finFET) device is provided. The method includes providing a substrate with a plurality of fins and a plurality of gate structures, and the plurality of gate structures are formed over the plurality of fins. There are isolation structures formed between the plurality of fins. The method also includes recessing exposed portions the plurality of fins and removing a dielectric material of the isolation structures, and performing a pre-amorphous implantation (PAI) process on portions of a semiconductor layer to amorphize the portions of the semiconductor layer. The method further includes performing an anneal process to recrystallize amorphized portions of the semiconductor layer, and growing an epitaxial silicon-containing material on the recrystallized portions of the semiconductor layer to form source and drain regions of the finFET device.

It is understood that different embodiments disclosed herein offer different disclosure, and that they may make various changes, substitutions, and alterations herein without departing from the spirit and scope of the present disclosure. For example, the embodiments disclosed herein describe formation of a tensile stress in a fin region. However, other embodiments may include forming a compressive stress in fin region by providing the relevant stress layer (e.g., stress-transferring layer) overlying the fin region. Examples of compressive stress generating films may include metal nitride compositions.

What is claimed is:

1. A semiconductor device, comprising:
   a substrate having a fin-type field-effect-transistor (finFET) region;
   a gate structure formed over two neighboring fin structures, the two neighboring fin structures being on the substrate in the finFET region, wherein the two neighboring fin structures contain a crystalline silicon-containing material, and wherein portions of the two neighboring fin structures protrude above neighboring isolation structures on the substrate; and
   a merged source/drain region between the two neighboring fin structures and proximate the gate structure, wherein no isolation region is below the merged source/drain region in a region extending laterally from between the two neighboring fin structures, dislocations are in the merged source/drain region.

2. The semiconductor device of claim 1, wherein the dislocations have pinchoff points at depths in a range from about 5 nm to about 30 nm below a bottom surface of the neighboring isolation structures of the gate structure.

3. The semiconductor device of claim 1, wherein the dislocations are formed in the direction.

4. The semiconductor device of claim 1, wherein at least one of the dislocations has an angle in a range from about 45 degrees to about 60 degrees from a surface parallel to surface of the substrate.

5. The semiconductor device of claim 1, wherein the merged source/drain region with dislocations has a depth in a range from about 15 nm to about 60 nm from a top surface of a semiconductor layer, wherein the top surface is next to a gate dielectric layer.

6. The semiconductor device of claim 1, wherein a top surface of the merged source/drain region concave and is above a top surface of a semiconductor layer, wherein the top surface of the semiconductor layer is next to a gate dielectric layer.

7. The semiconductor device of claim 1, wherein the fin-type field-effect-transistor (finFET) region includes an n-type metal-oxide-semiconductor (NMOS) field-effect transistor (FET).

8. The semiconductor device of claim 1, wherein the merged source/drain region includes an epitaxial stress-inducing material, wherein the epitaxial stress-inducing material includes SiC, SiP, SiCP, Si, or a combination thereof.

9. A semiconductor device, comprising:
   a substrate having a fin-type field-effect-transistor (finFET) region;
   two neighboring gate structures formed over two neighboring fin structures in the finFET region, wherein the two neighboring fin structures contain a crystalline silicon-containing material, and wherein portions of the two neighboring fin structures protrude above neighboring isolation structures on the substrate; and
   a merged source/drain region extending between the two neighboring fin structures and being between the two neighboring gate structures, wherein dislocations are in the merged source/drain region, and wherein no isolation structure is disposed between the merged source/drain region and the substrate in a region extending laterally from between the neighboring fin structures between the neighboring gate structures.

10. The semiconductor device of claim 9, wherein the dislocations have pinchoff points at depths in a range from about 5 nm to about 30 nm below a bottom surface of the neighboring isolation structures of the two neighboring gate structures.

11. The semiconductor device of claim 9, wherein the dislocations are formed in the direction.

12. The semiconductor device of claim 9, wherein at least one of the dislocations has an angle in a range from about 45 degrees to about 60 degrees from a surface parallel to surface of the substrate.

13. The semiconductor device of claim 9, wherein the merged source/drain region with dislocations has a in a range from about 15 nm to about 60 nm from a top surface of a semiconductor layer, wherein the top surface is next to a gate dielectric layer.

14. The semiconductor device of claim 9, wherein a top surface of the merged source/drain region is concave and is above a top surface of a semiconductor layer, wherein the top surface of the semiconductor layer is next to a gate dielectric layer.

15. The semiconductor device of claim 1, wherein the fin-type field-effect-transistor (finFET) region includes an n-type metal-oxide-semiconductor (NMOS) field-effect transistor (FET).

16. The semiconductor device of claim 1, wherein the merged source/drain region includes an epitaxial stress-inducing material, wherein the epitaxial stress-inducing material includes SiC, SiP, SiCP, Si, or a combination thereof.

17. A semiconductor device comprising:
a substrate with at least two fins extending therefrom;
a gate structure extending over the at least two fins;
a first merged source/drain region and a second merged source/drain region each extending between the at least two fins and being on opposite sides of the gate structure;
a plurality of first dislocations in the first merged source/drain region, at least one dislocation of the plurality of first dislocations extending from the substrate underlying the at least two fins, no isolation structure being below the first merged source/drain region and extending laterally from between the at least two fins; and
a plurality of second dislocations in the second merged source/drain region, at least one dislocation of the plurality of second dislocations extending from the substrate underlying the at least two fins, no isolation structure being below the second merged source/drain region and extending laterally from between the at least two fins.

18. The semiconductor device of claim 17, wherein at least one dislocation of the plurality of first dislocations has an angle in a range from about 45 degrees to about 60 degrees from a surface parallel to surface of the substrate.

* * * * *